(12) United States Patent  
Kim

(10) Patent No.: US 11,430,802 B2  
(45) Date of Patent: Aug. 30, 2022

(54) NONVOLATILE MEMORY DEVICE INCLUDING ERASE TRANSISTORS

(71) Applicant: SAMSUNG ELECTRONICS CO., LTD., Suwon-si (KR)

(72) Inventor: Chanho Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/155,525

(22) Filed: Jan. 22, 2021

(65) Prior Publication Data

US 2022/0052066 A1 Feb. 17, 2022

(30) Foreign Application Priority Data

Aug. 13, 2020 (KR) ........................ 10-2020-0101695

(51) Int. Cl.
| | |
|---|---|
| H01L 27/11 | (2006.01) |
| G11C 16/00 | (2006.01) |
| H01L 27/11573 | (2017.01) |
| H01L 25/065 | (2006.01) |
| H01L 25/18 | (2006.01) |
| H01L 23/00 | (2006.01) |
| H01L 27/11529 | (2017.01) |
| H01L 27/11556 | (2017.01) |
| H01L 27/11582 | (2017.01) |

(Continued)

(52) U.S. Cl.
CPC .... *H01L 27/11573* (2013.01); *G11C 16/0483* (2013.01); *G11C 16/10* (2013.01); *G11C 16/16* (2013.01); *G11C 16/26* (2013.01); *H01L 23/5226* (2013.01); *H01L 24/05* (2013.01); *H01L 24/08* (2013.01); *H01L 25/0657* (2013.01); *H01L 25/18* (2013.01); *H01L 27/11529* (2013.01); *H01L 27/11556* (2013.01); *H01L 27/11582* (2013.01); *G11C 2216/04* (2013.01); *H01L 2224/05147* (2013.01); *H01L 2224/08145* (2013.01); *H01L 2924/1431* (2013.01); *H01L 2924/14511* (2013.01)

(58) Field of Classification Search
None
See application file for complete search history.

(56) References Cited

U.S. PATENT DOCUMENTS

| | | |
|---|---|---|
| 8,860,117 B2 | 10/2014 | Tanzawa |
| 9,391,088 B2 | 7/2016 | Nam |

(Continued)

*Primary Examiner* — Tan T. Nguyen  
(74) *Attorney, Agent, or Firm* — Volentine, Whitt & Francos, PLLC

(57) ABSTRACT

A nonvolatile memory device includes bitlines, a source line, cell channel structures, a gate electrode structure, erase channel structures and an erase selection line. The bitlines are disposed at a first end portion of a cell region, arranged in a first horizontal direction and extend in a second horizontal direction. The source line is disposed at a second end portion of the cell region and extend in the second horizontal direction. The cell channel structures are disposed in a cell string area of the cell region and are respectively connected between the bitlines and the source line. The erase channel structures are disposed in a contact area of the cell region and respectively connected between the bitlines and the source line. The erase channel structures include erase transistors. The erase selection line is disposed in the contact area to form a gate electrode of the erase transistors.

20 Claims, 20 Drawing Sheets

(51) Int. Cl.
  *G11C 16/04* (2006.01)
  *G11C 16/10* (2006.01)
  *G11C 16/16* (2006.01)
  *G11C 16/26* (2006.01)
  *H01L 23/522* (2006.01)

(56) References Cited

U.S. PATENT DOCUMENTS

| | | |
|---|---|---|
| 9,679,650 B1 | 6/2017 | Sakui |
| 9,728,266 B1 | 8/2017 | Goda et al. |
| 9,865,311 B1 | 1/2018 | Sakui |
| 9,916,901 B1 | 3/2018 | Saito et al. |
| 10,134,756 B2 | 11/2018 | Shim et al. |
| 10,141,326 B1 | 11/2018 | Oh et al. |
| 10,170,490 B2 | 1/2019 | Tanzawa |
| 10,615,173 B2 | 4/2020 | Kim et al. |
| 2020/0020717 A1* | 1/2020 | Lee ........................ G11C 16/16 |
| 2020/0273877 A1* | 8/2020 | Yun ........................ G11C 16/16 |
| 2020/0303410 A1* | 9/2020 | Kanamori ............... G11C 16/08 |
| 2021/0391000 A1* | 12/2021 | Lee ...................... G11C 11/4094 |
| 2022/0093180 A1* | 3/2022 | Kwon ............... H01L 27/11582 |

* cited by examiner

NONVOLATILE MEMORY DEVICE INCLUDING ERASE TRANSISTORS

CROSS-REFERENCE TO RELATED APPLICATION

This U.S. non-provisional application claims priority under 35 USC § 119 to Korean Patent Application No. 10-2020-0101695 filed on Aug. 13, 2020 in the Korean Intellectual Property Office (KIPO), the subject matter of which is hereby incorporated by reference.

BACKGROUND

1. Technical Field

Embodiments of the inventive concept relate generally to semiconductor integrated circuits, and more particularly to nonvolatile memory devices including an erase transistor.

2. Discussion of the Related Art

In order to increase integration density, various vertical memory devices have been developed which vertically stack memory cells in a memory cell array. Vertical memory devices generally include channel structures extending in a vertical direction, as well as an alternatingly stacked arrangement of gate electrodes and insulating layers surrounding the channel structures. Even though the overall size of many memory devices may be reduce through the use of a vertical structure, the resulting size reductions may nonetheless be restricted by the peripheral circuits (e.g., page buffers) associated with the memory cell array.

SUMMARY

Embodiments of the inventive concept may provide nonvolatile memory devices exhibiting markedly reduced size.

According to certain embodiments of the inventive concept, a nonvolatile memory device includes; bitlines disposed at a first end portion of a cell region, arranged in a first horizontal direction and extending in a second horizontal direction, at least one source line disposed at a second end portion of the cell region and extending in the second horizontal direction, cell channel structures disposed in a cell string area of the cell region, wherein each one of the cell channel structures is connected between the bitlines and the source line and includes at least one string selection transistor, at least one ground selection transistor and memory cells, a gate electrode structure vertically stacked in the cell string area, wherein the gate electrode structure includes at least one string selection line, at least one ground selection transistor and wordlines, erase channel structures disposed in a contact area of the cell region, wherein each one of the erase channel structures is connected between the bitlines and the source line and includes erase transistors, and an erase selection line disposed in the contact area to form a gate electrode of the erase transistors.

According to certain embodiments of the inventive concept, a nonvolatile memory having a cell over periphery (COP) structure includes a peripheral region including a peripheral circuit and a cell region vertically stacked on the peripheral region and including a memory cell array. The nonvolatile memory device further includes; erase channel structures disposed in a contact area adjacent to the memory cell array in a horizontal direction and connected between bitlines and a source line, wherein each one of the erase channel structures includes erase transistors, and an erase selection line disposed on the contact area to form a gate electrode of the erase transistors.

According to certain embodiments of the inventive concept, a nonvolatile memory device includes; first metal pads disposed in a cell region, second metal pads disposed in a peripheral region disposed under the cell region, wherein the peripheral region is vertically connected to the memory cell region by the first metal pads and the second metal pads, bitlines disposed at a first end portion of the cell region, arranged in a first horizontal direction and extending in a second horizontal direction, at least one source line disposed at a second end portion of the cell region and extending in the second horizontal direction, cell channel structures disposed in a cell string area of the cell region and respectively connected between the bitlines and the source line, wherein each one of the cell channel structures includes at least one string selection transistor, at least one ground selection transistor, and memory cells, a gate electrode structure vertically stacked in the cell string area, wherein the gate electrode structure includes at least one string selection line, at least one ground selection transistor and wordlines, erase channel structures disposed in a contact area of the cell region, wherein each one of the erase channel structures is connected between the bitlines and the source line and includes erase transistors, and an erase selection line disposed in the contact area to form a gate electrode of the erase transistors.

BRIEF DESCRIPTION OF THE DRAWINGS

Certain embodiments of the inventive concept will be described in conjunction with the accompanying drawings.

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below;

under/over; upper/lower; center/side; surrounding; overlay/underlay; etc.

In this regard, a vertical direction D3 indicates a direction perpendicular to an upper surface of a semiconductor substrate, and a first horizontal direction D1 and a second horizontal direction D2 indicate two directions parallel to the upper surface of the semiconductor substrate. The first horizontal direction D1 and the second horizontal direction D2 may be substantially perpendicular. Here, the first horizontal direction D1 may be referred to as a first direction, the second horizontal direction D2 may be referred to as a second direction and the vertical direction D3 may be referred to as a third direction. The direction indicated by an arrow in figures and the opposite direction may be considered as the same direction.

Figure 1:
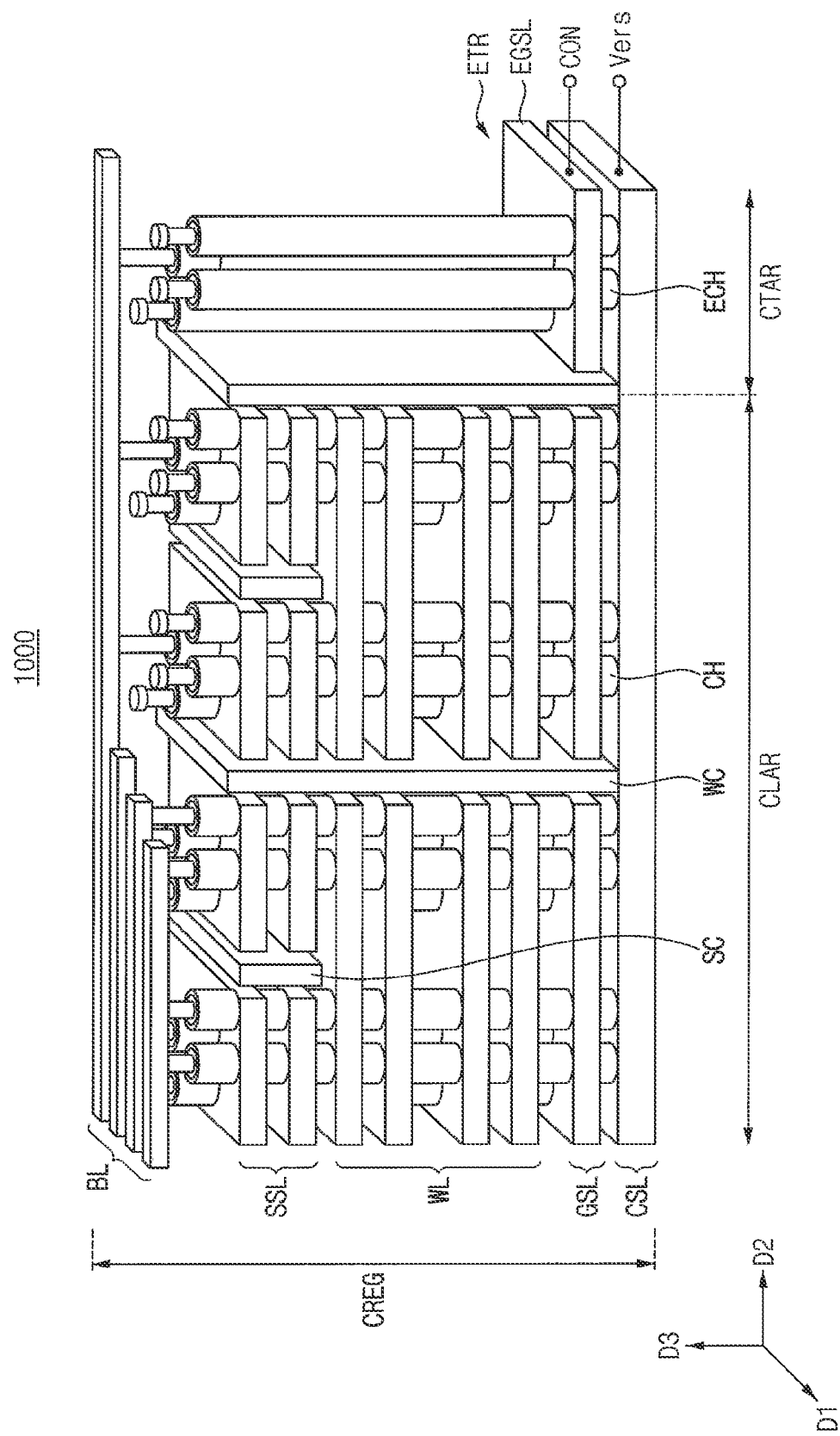
FIG. 1 is a perspective view illustrating a nonvolatile memory device according to embodiments of the inventive concept.

Figure (FIG. 1 is a cross-sectional view illustrating a nonvolatile memory device 1000 according to embodiments of the inventive concept.

Referring to FIG. 1, the nonvolatile memory device 1000 may include bitlines BL, at least one source line CSL, cell channel structures CH, a gate electrode structure, erase channel structures ECH and an erase selection line EGSL.

The bitlines BL may be disposed at a first end (in the vertical direction D3) of a cell region CREG. The bitlines BL may be arranged in the first horizontal direction D1 and extend in the second horizontal direction D2.

The source line CSL may be disposed at a second end (in the vertical direction D3) of the cell region CREG and extend in the second horizontal direction D2. In some embodiments, the source line CSL may include multiple lines arranged in the first horizontal direction D1. In some embodiments like the one illustrated in FIG. 1, the source line CSL may be implemented as a common source line having a planar shape.

In some embodiments like the one illustrated in FIG. 1, the source line CSL may uninterruptedly extend (e.g., without cutting) in the second horizontal direction D2 to a cell string area CLAR and a contact area CTAR. With this configuration, the source line CSL may be commonly connected to the cell channel structures CH and the erase channel structures ECH. Accordingly, an erase voltage Vers applied to the source line CSL may be applied to the bottom portions of the cell channel structures CH, and simultaneously applied to the upper portions of the cell channel structures CH through the erase channel structures ECH and the bitlines BL.

Figure 15:
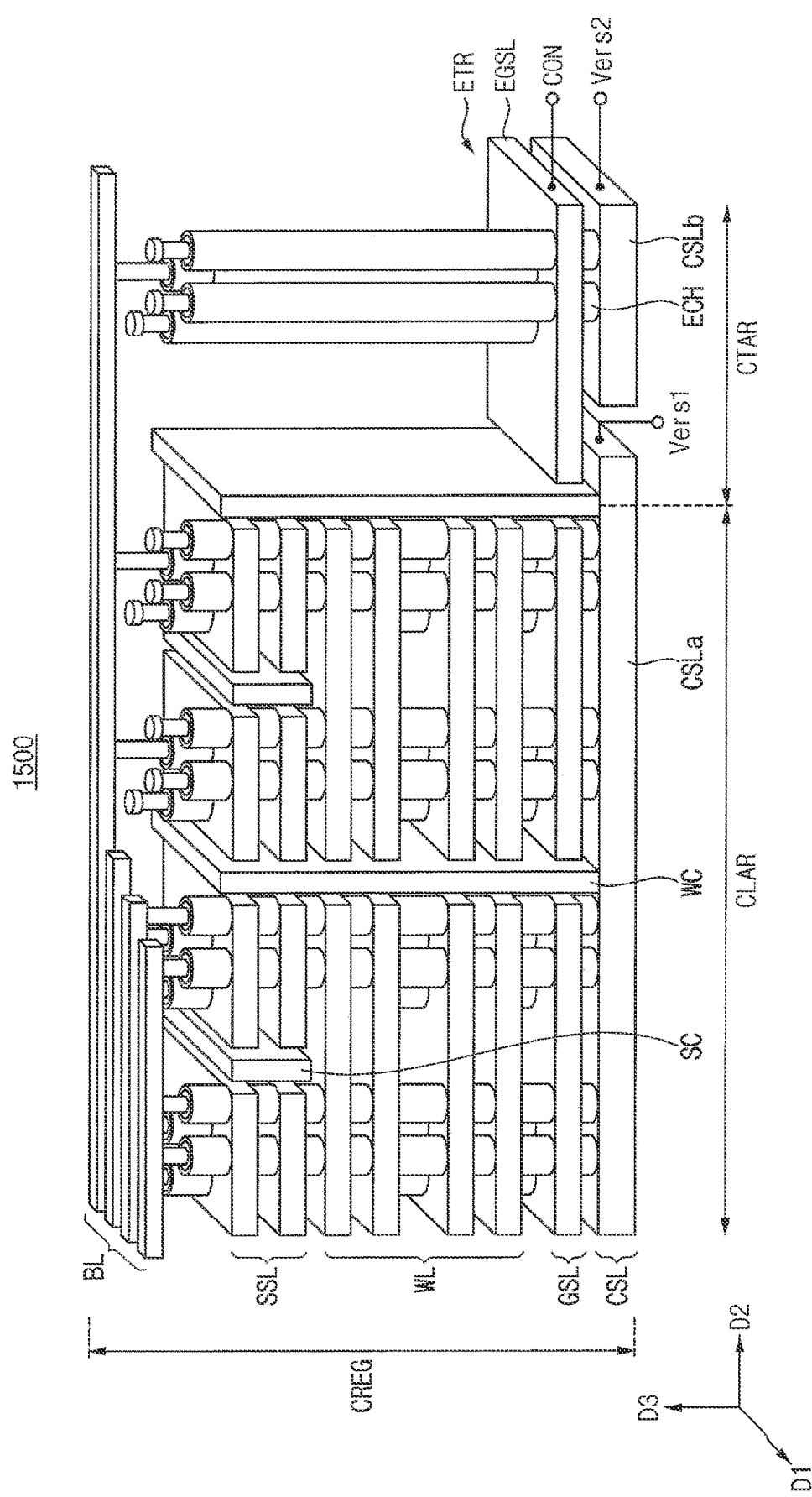
FIG. 15 is a perspective view illustrating another nonvolatile memory device according to embodiments of the inventive concept.

Alternately, in some embodiments like the one described hereafter in relation to FIG. 15, the source line CSL may be cut at a boundary between the cell string area CLAR and the contact area CTAR, such that the source line is effectively divided into a first source line segment and a second source line segment.

The cell channel structures CH may be disposed in the cell string area CLAR of the cell region CREG and respectively connected between the bitlines BL and the source line CSL. As will be described hereafter, each cell channel structure CH may include at least one string selection transistor, a memory cells and at least one ground selection transistor.

The gate electrode structure may include vertically stacked gate lines (in the vertical direction D3) in the cell string area CLAR. The gate electrode structure may include at least one string selection line SSL, wordlines WL and at least one ground selection line GSL. The string selection line SSL corresponds to gate electrodes of the string selection transistors, the wordlines WL correspond to gate electrodes of the memory cells and the ground selection line GSL corresponds to gate electrodes of the ground selection transistors. The wordlines WL may be cut by wordline cut areas WC, and the string selection line SSL may be cut by the wordline cut areas WC and string selection line cut arrears SC.

FIG. 1 illustrates an example including two (2) string selection lines SSL and the one (1) ground selection line GSL, however the number of the string selection lines and the number of the ground selection lines may vary with design.

The erase channel structures ECH may be disposed in the contact area CTAR of the cell region CREG The erase channel structures ECH may be respectively connected between the bitlines BL and the source line CSL. The erase channel structures ECH may include erase transistors ETR.

The erase selection line EGSL may be disposed in the contact area CTAR to form a gate electrode of the erase transistors ETR. The erase transistor ETR may be switched by a control signal CON having a turn-ON voltage and/or a turn-OFF voltage according to operating mode(s). During an erase operation, the erase transistor ETR may be turned ON by applying the turn-ON voltage to the erase selection line EGSL to apply an erase voltage Vers provided by the source line CSL to the bitline BL. In contrast, during a program operation or a read operation, the erase transistor ETR may be turned OFF by applying the turn-OFF voltage to the erase selection line EGSL to electrically disconnect the bitline BL from the source line CSL.

In the illustrated example of FIG. 1, the ground selection transistor of the cell channel structure CH and the erase transistor ETR of the erase channel structure ECH may be disposed at the same "height" (e.g., a distance relative to a horizontally disposed substrate, as measured in the vertical direction D3). In this case, the erase selection line EGSL may be a portion of the ground selection line GSL such that the portion corresponding to the erase selection line GSL may be provided by cutting the ground selection line GSL at the boundary between the cell string area CLAR and the contact area CTAR. For example, the ground selection line GSL may be cut by the wordline cut area WC at the boundary between the cell string area CLAR and the contact area CTAR, and the portion of the ground selection line GSL in the contact area CTAR may be implemented as the erase selection line EGSL.

Although not specifically illustrated in FIG. 1, the nonvolatile memory device 1000 may include page buffers connected to the bitlines BL as will be described hereafter. Conventionally, an erase transistor used to selectively apply the erase voltage to a bitline is included in the page buffer, thereby increasing the overall size of the page buffer. In contrast, embodiments of the inventive concept provide the erase transistor ETR in the contact area CTAR of the cell region CREG, thereby effectively decreasing the overall size of the page buffer. Recognizing that nonvolatile memory devices usually includes a large number of page buffers, the reduction in size of an individual page buffer—as provided by embodiments of the inventive concept—result in a marked reduction in size for the nonvolatile memory device.

Accordingly, nonvolatile memory devices according to embodiments of the inventive concept include page buffer circuit(s) of reduced size. That is, nonvolatile memory devices according to embodiments of the inventive concept include page buffer circuit(s) reduced in size by removing the erase transistor ETR used to apply the erase voltage Vers to the bitline BL from the page buffer circuit, and instead, implementing the erase transistor ETR using the erase channel structure ECH.

Figure 2:
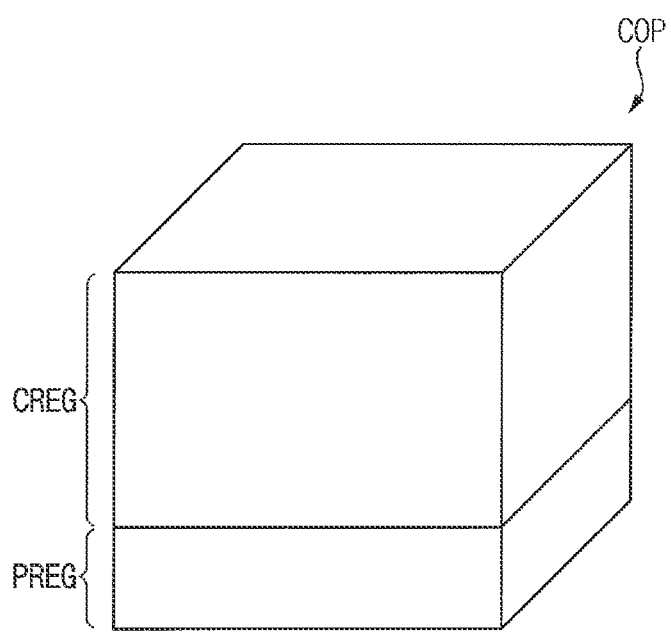
FIG. 2 is a perspective view illustrating a nonvolatile memory device having a cell over periphery (COP) structure according to embodiments of the inventive concept.
Figure 2:
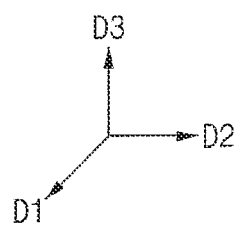

FIG. 2 is a perspective view generally illustrating a nonvolatile memory device having a cell over periphery (COP) structure according to embodiments of the inventive concept.

Referring to FIG. 2, a nonvolatile memory device may include a peripheral region PREG, in which peripheral circuit(s) may be disposed, and a cell region CREG in which memory cell array(s) may be disposed.

The peripheral region PREG may include a semiconductor substrate, a peripheral circuit formed on a top surface of the semiconductor substrate and a lower insulation layer covering the peripheral circuit. The memory cell region CREG may include a base layer formed on the lower insulation layer, a memory cell array formed on the base layer, and an upper insulation layer covering the memory cell array.

With this configuration, a memory device according to embodiments of the inventive concept may provide a reduced overall size (e.g., the lateral area or footprint) by adopting a COP structure in which one or more peripheral circuit(s) are disposed on a semiconductor substrate, and one or more memory cell array(s) are vertically stacked on the peripheral circuit(s). In addition, such memory devices may provide further reductions in overall size by removing erase transistor(s) from page buffer circuit(s) disposed in the peripheral region PREG, and instead, implementing the erase transistor(s) in the cell region using the erase channel structure ECH.

Figure 3:
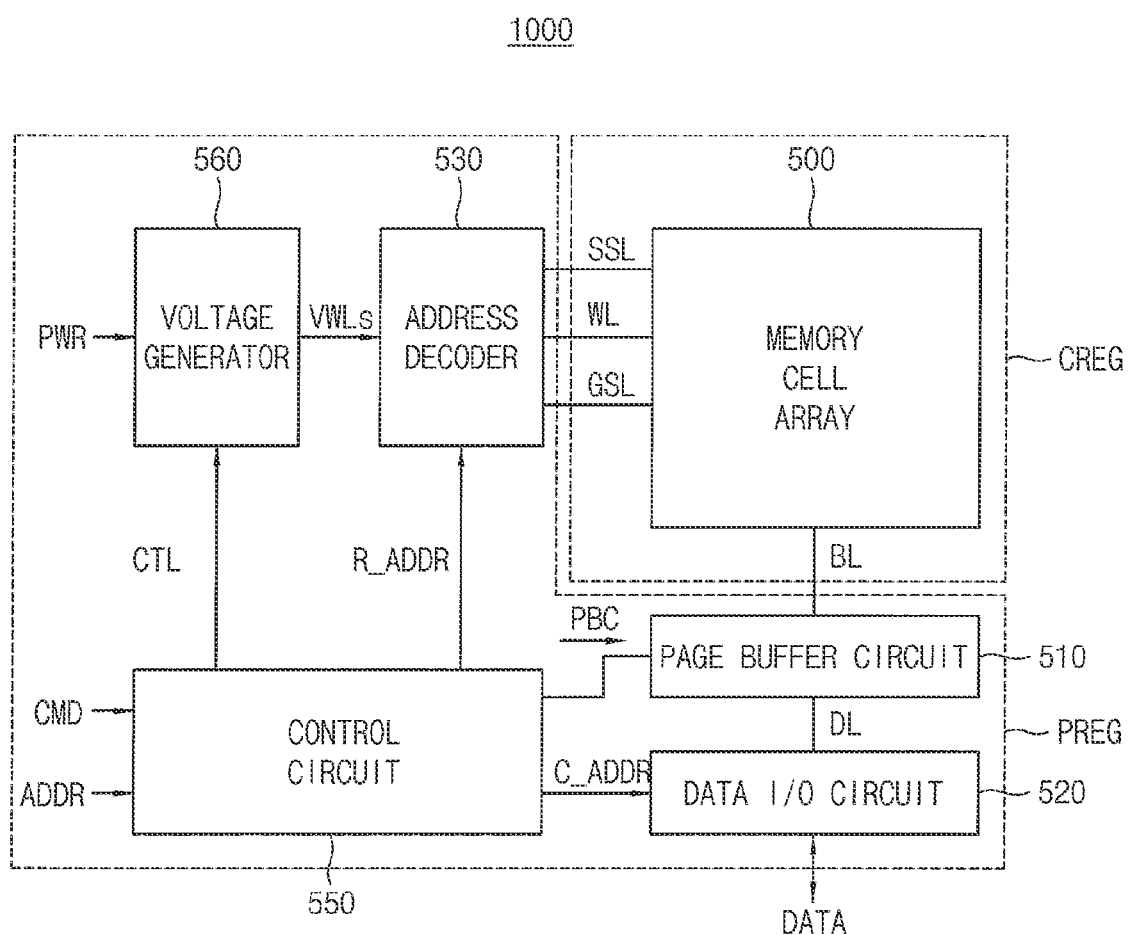
FIG. 3 is a block diagram illustrating a nonvolatile memory device according to embodiments of the inventive concept.

FIG. 3 is a block diagram illustrating a nonvolatile memory device according to embodiments of the inventive concept.

Referring to FIG. 3, the nonvolatile memory device 1000 may include a memory cell array 500, a page buffer circuit 510, a data input/output (I/O) circuit 520, an address decoder 530, a control circuit 550 and a voltage generator 560. The memory cell array 500 may be formed in the cell region CREG of FIG. 2, and the page buffer circuit 510, the data I/O circuit 520, the address decoder 530, the control circuit 550 and the voltage generator 560 may be formed in the peripheral region PREG of FIG. 2, for example.

The memory cell array 500 may be coupled to the address decoder 530 through string selection lines SSL, wordlines WL, and ground selection lines GSL. In addition, the memory cell array 500 may be coupled to the page buffer circuit 510 through a bitlines BL. The memory cell array 500 may include a memory cells coupled to the wordlines WL and the bitlines BL. In some embodiments, the memory cell array 500 may be a three-dimensional memory cell array, which is formed on a substrate in a three-dimensional structure (or a vertical structure). In this case, the memory cell array 500 may include cell strings (e.g., NAND strings) that are vertically oriented such that at least one memory cell is located over another memory cell.

The control circuit 550 may receive a command (signal) CMD and an address (signal) ADDR from a memory controller and control erase, program and read operations of the nonvolatile memory device 1000 in response to (or based on) at least one of the command signal CMD and the address signal ADDR. An erase operation may comprise performing a sequence of erase loops, and a program operation may include performing a sequence of program loops. Each program loop may include a program operation and a program verification operation. Each erase loop may include an erase operation and an erase verification operation. The read operation may include a normal read operation and data recover read operation.

For example, the control circuit 550 may generate the control signals CTL used to control the operation of the voltage generator 560, and may generate the page buffer control signal PBC for controlling the page buffer circuit 510, based on the command signal CMD, and generate the row address R_ADDR and the column address C_ADDR based on the address signal ADDR. The control circuit 550 may provide the row address R_ADDR to the address decoder 530 and provide the column address C_ADDR to the data I/O circuit 520.

The address decoder 530 may be coupled to the memory cell array 500 through the string selection lines SSL, the wordlines WL, and the ground selection lines GSL. During the program operation or the read operation, the address decoder 530 may determine (or select) one of the wordlines WL as a selected wordline and determine the remaining wordlines WL except for the selected wordline as unselected wordlines based on the row address R_ADDR.

In addition, during the program operation or the read operation, the address decoder 530 may determine one of the string selection lines SSL as a selected string selection line and determine rest of the string selection lines SSL except for the selected string selection line as unselected string selection lines based on the row address R_ADDR.

The voltage generator 560 may generate wordline voltages VWL, which are required for the operation of the memory cell array 500 of the nonvolatile memory device 1000, based on the control signals CTL. The voltage generator 560 may receive the power PWR from the memory controller. The wordline voltages VWL may be applied to the wordlines WL through the address decoder 530.

For example, during the erase operation, the voltage generator 560 may apply an erase voltage to a well and/or a common source line of a memory block and apply an erase permission voltage (e.g., a ground voltage) to all of the wordlines of the memory block or a portion of the wordlines based on an erase address. In addition, during the erase verification operation, the voltage generator 560 may apply an erase verification voltage simultaneously to all of the wordlines of the memory block or sequentially (e.g., one-by-one) to the wordlines.

For example, during the program operation, the voltage generator 560 may apply a program voltage to the selected wordline and may apply a program pass voltage to the unselected wordlines. In addition, during the program verification operation, the voltage generator 560 may apply a program verification voltage to the first wordline and may apply a verification pass voltage to the unselected wordlines.

In addition, during the normal read operation, the voltage generator 560 may apply a read voltage to the selected wordline and may apply a read pass voltage to the unselected wordlines. During the data recover read operation, the voltage generator 560 may apply the read voltage to a wordline adjacent to the selected wordline and may apply a recover read voltage to the selected wordline.

The page buffer circuit 510 may be coupled to the memory cell array 500 through the bitlines BL. The page buffer circuit 510 may include multiple buffers. In some embodiments, each buffer may be connected to only a single bitline. In other embodiments, each buffer may be connected to two or more bitlines. The page buffer circuit 510 may temporarily store data to be programmed in a selected page or data read out from the selected page of the memory cell array 500.

The data I/O circuit 520 may be coupled to the page buffer circuit 510 through data lines DL. During the program operation, the data I/O circuit 520 may receive program data DATA received from the memory controller and provide the program data DATA to the page buffer circuit 510 based on the column address C_ADDR received from the control circuit 550. During the read operation, the data I/O circuit 520 may provide read data DATA, having been read from the memory cell array 500 and stored in the page buffer circuit 510, to the memory controller based on the column address C_ADDR received from the control circuit 550.

In addition, the page buffer circuit 510 and the data I/O circuit 520 may read data from a first area of the memory cell array 500 and write this read data to a second area of the memory cell array 500 (e.g., without transmitting the data to a source external to the nonvolatile memory device 1000, such as to the memory controller). That is, the page buffer circuit 510 and the data I/O circuit 520 may perform a copy-back operation.

Figure 4:
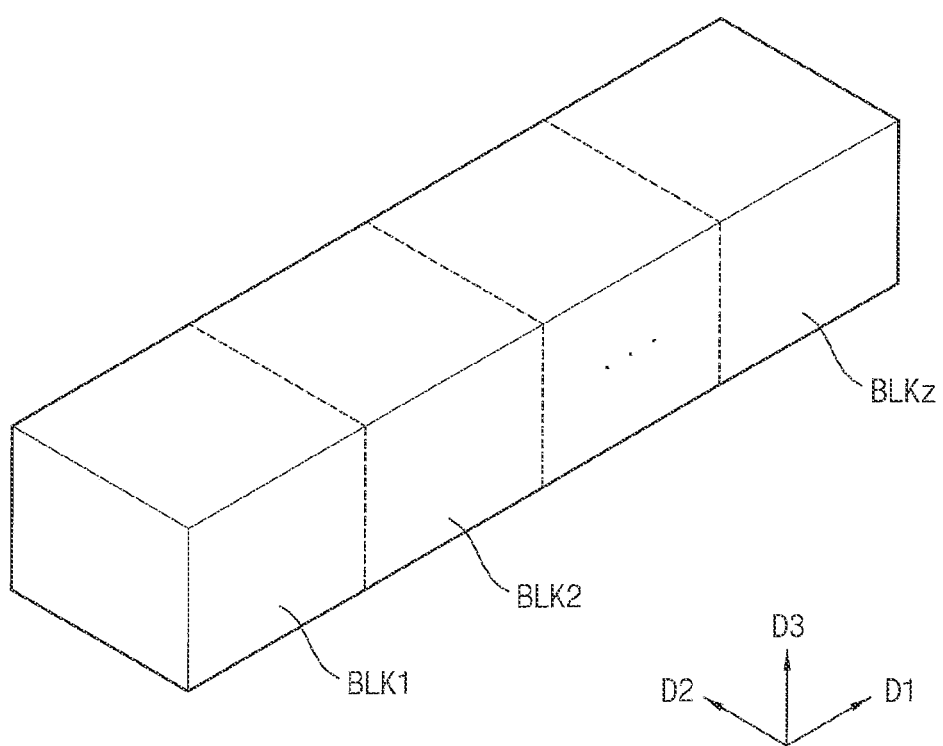
FIG. 4 is a block diagram illustrating a memory cell array structure that may be included in the nonvolatile memory device of FIG. 3.
Figure 5:
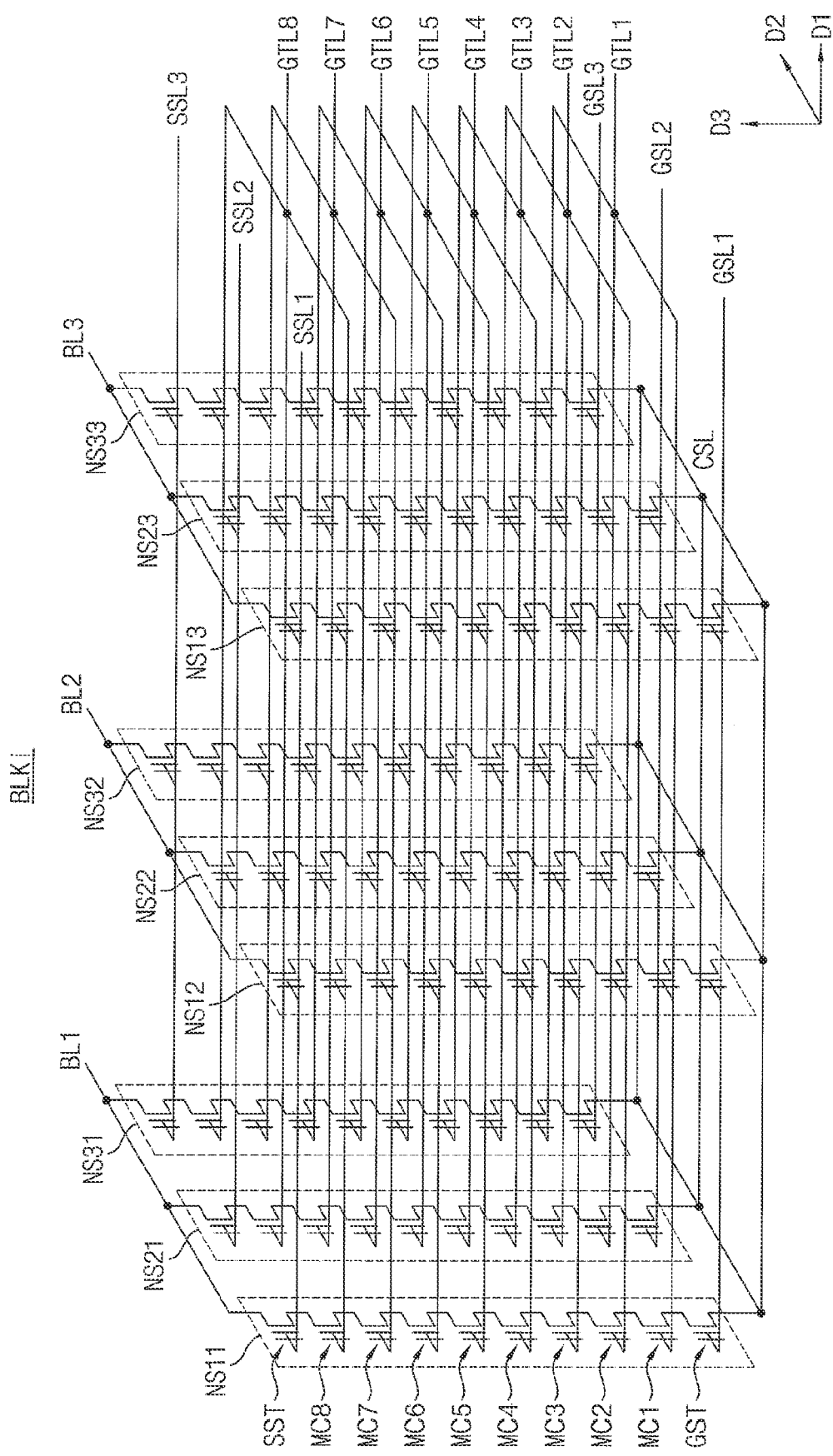
FIG. 5 is an equivalent circuit diagram of the memory block BLKi included in the memory cell array of FIG. 4.

FIG. 4 is a block diagram illustrating in one example a memory cell array that may be included in the nonvolatile memory device of FIG. 3, and FIG. 5 is an equivalent circuit diagram for a memory block BLKi of the memory cell array of FIG. 4.

Referring to FIG. 4, the memory cell array 500 may include memory blocks BLK1 to BLKz. In some embodiments, the memory blocks BLK1 to BLKz may be selected by the address decoder 430 of FIG. 3. For example, the address decoder 430 may select a particular memory block BLK corresponding to a block address among the memory blocks BLK1 to BLKz.

The memory block BLKi of FIG. 5 may be formed on a substrate in a three-dimensional structure (or a vertical structure). For example, NAND strings or cell strings included in the memory block BLKi may be formed in the first horizontal direction D1 perpendicular to the upper surface of the substrate.

Referring to FIG. 5, the memory block BLKi may include NAND strings NS11 to NS33 coupled between bitlines BL1, BL2 and BL3 and a common source line CSL. Each of the NAND strings NS11 to NS33 may include a string selection transistor SST, a memory cells MC1 to MC8, and a ground selection transistor GST. In FIG. 5, each of the NAND strings NS11 to NS33 is illustrated to include eight memory cells MC1 to MC8. However, embodiments are not limited thereto. In some embodiments, each of the NAND strings NS11 to NS33 may include any number of memory cells.

Each string selection transistor SST may be connected to a corresponding string selection line (one of SSL1 to SSL3). The memory cells MC1 to MC8 may be connected to corresponding gate lines GTL1 to GTL8, respectively. The gate lines GTL1 to GTL8 may be wordlines and some of the gate lines GTL1 to GTL8 may be dummy wordlines. Each ground selection transistor GST may be connected to a corresponding ground selection line (one of GSL1 to GSL3). Each string selection transistor SST may be connected to a corresponding bitline (e.g., one of BL1, BL2 and BL3), and each ground selection transistor GST may be connected to the common source line CSL.

Wordlines (e.g., WL1) having the same height may be commonly connected, and the ground selection lines GSL1 to GSL3 and the string selection lines SSL1 to SSL3 may be separated. Even though not illustrated, the gate lines corresponding to the intermediate switching lines may be separated as will be described below. In FIG. 5, the memory block BLKi is illustrated to be coupled to eight gate lines GTL1 to GTL8 and three bitlines BL1 to BL3. However, embodiments are not limited thereto. Each memory block in the memory cell array 500 may be coupled to any number of wordlines and any number of bitlines.

Figure 6:
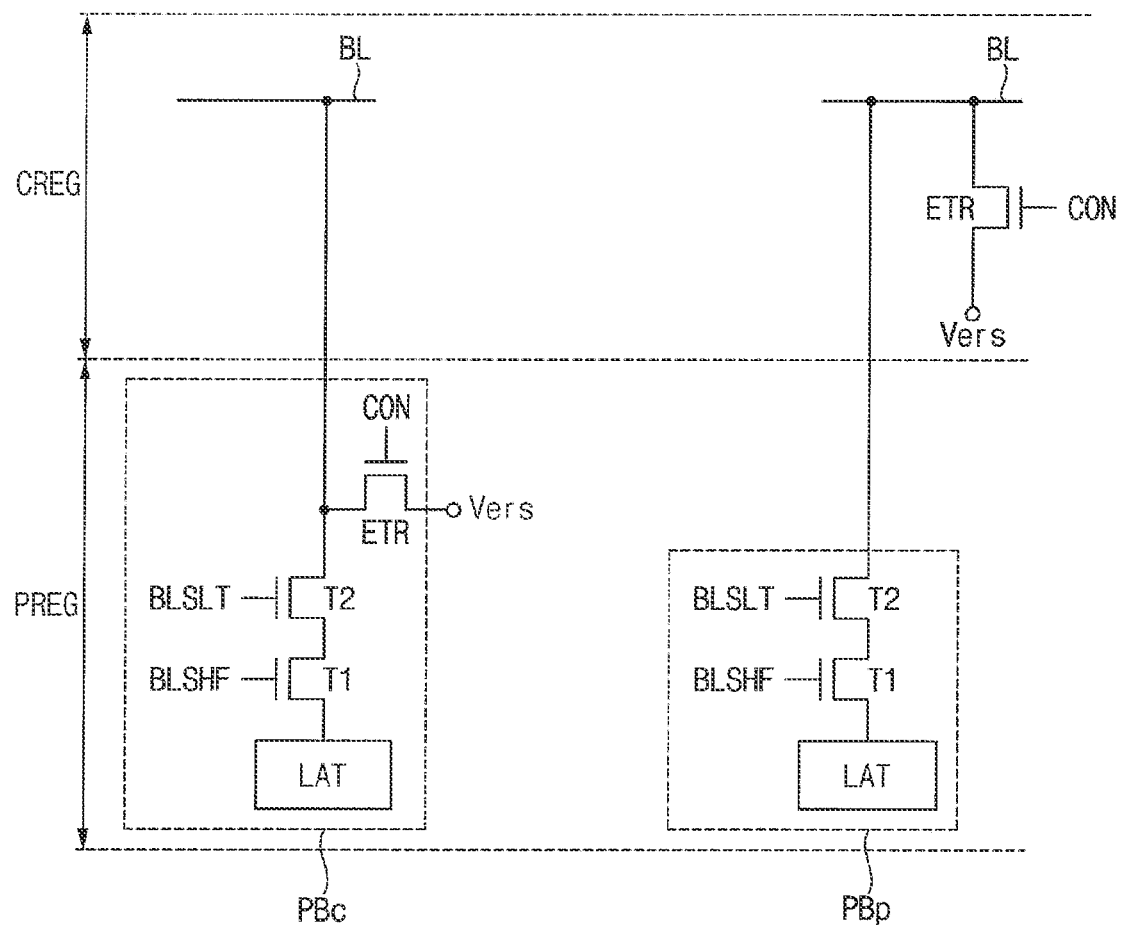
FIG. 6 is a circuit diagram illustrating a comparative example and a nonvolatile memory device according to embodiments of the inventive concept.

FIG. 6 is a circuit diagram illustrating one approach to size reduction provided by nonvolatile memory devices according to embodiments of the inventive concept.

As has been previously noted, a large number of page buffers may be disposed in the peripheral region PREG, for example when the number of the page buffers is equal (or proportional) to the number of bitlines BL. With this in mind, FIG. 6 includes a comparative example page buffer PBc (consistent with certain conventional implementations of a page buffer), as well as a page buffer PBp that may be included in a nonvolatile memory device according to embodiments of the inventive concept.

The comparative example page buffer PBc includes a latch circuit LAT, transistors T1 and T2 configured to control the electrical connection between the bitline BL and the latch circuit LAT in response to control signals BLSLT and BLSHF, and an erase transistor ETR configured to control application of the source voltage Vers to the bitline BL in response to a control signal CON. Of note, all of these elements are disposed in the peripheral region PREG.

In contrast, the page buffer PBc according to embodiments of the inventive concept does not include the erase transistor ETR within the peripheral region PREG. Instead, the erase transistor ETR is effectively moved to the cell region CREG. As described above, the erase transistor ETR may be implemented using the erase channel structure ECH in the cell region CREG.

As a result, the page buffer PBp according to embodiments of the inventive concept has a reduced overall size within the peripheral region PREG, as compared with the conventional page buffer PBc, achieved by removing the erase transistor ETR from the page buffer PBp. Thus, as previously noted, for nonvolatile memory devices including a large number of page buffers, and the overall size of the nonvolatile memory device may be greatly reduced by decreasing the size of the constituent individual page buffers.

Figure 7:
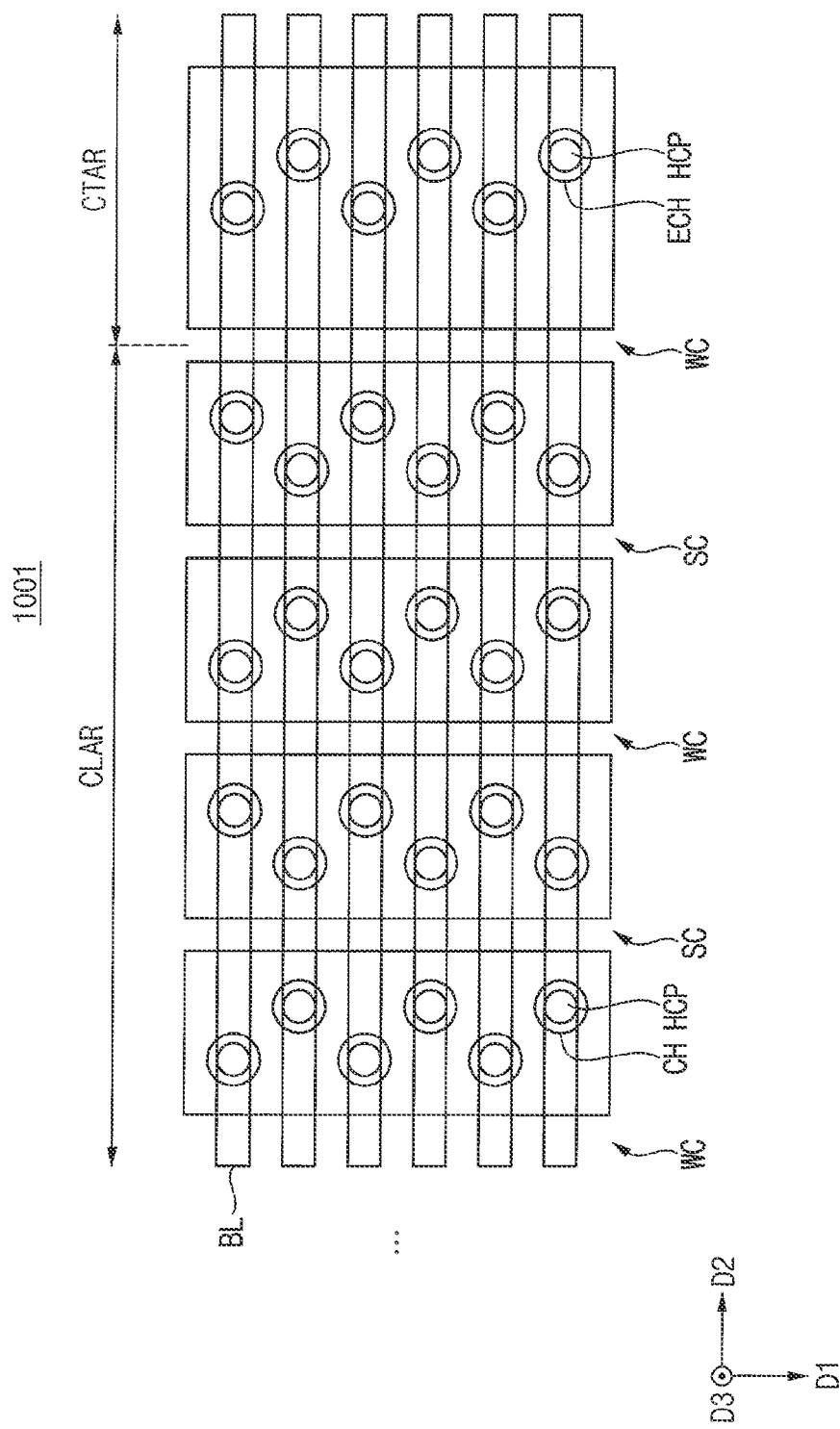
FIG. 7 is a plan view of a nonvolatile memory device according to embodiments of the inventive concept.
Figure 8:
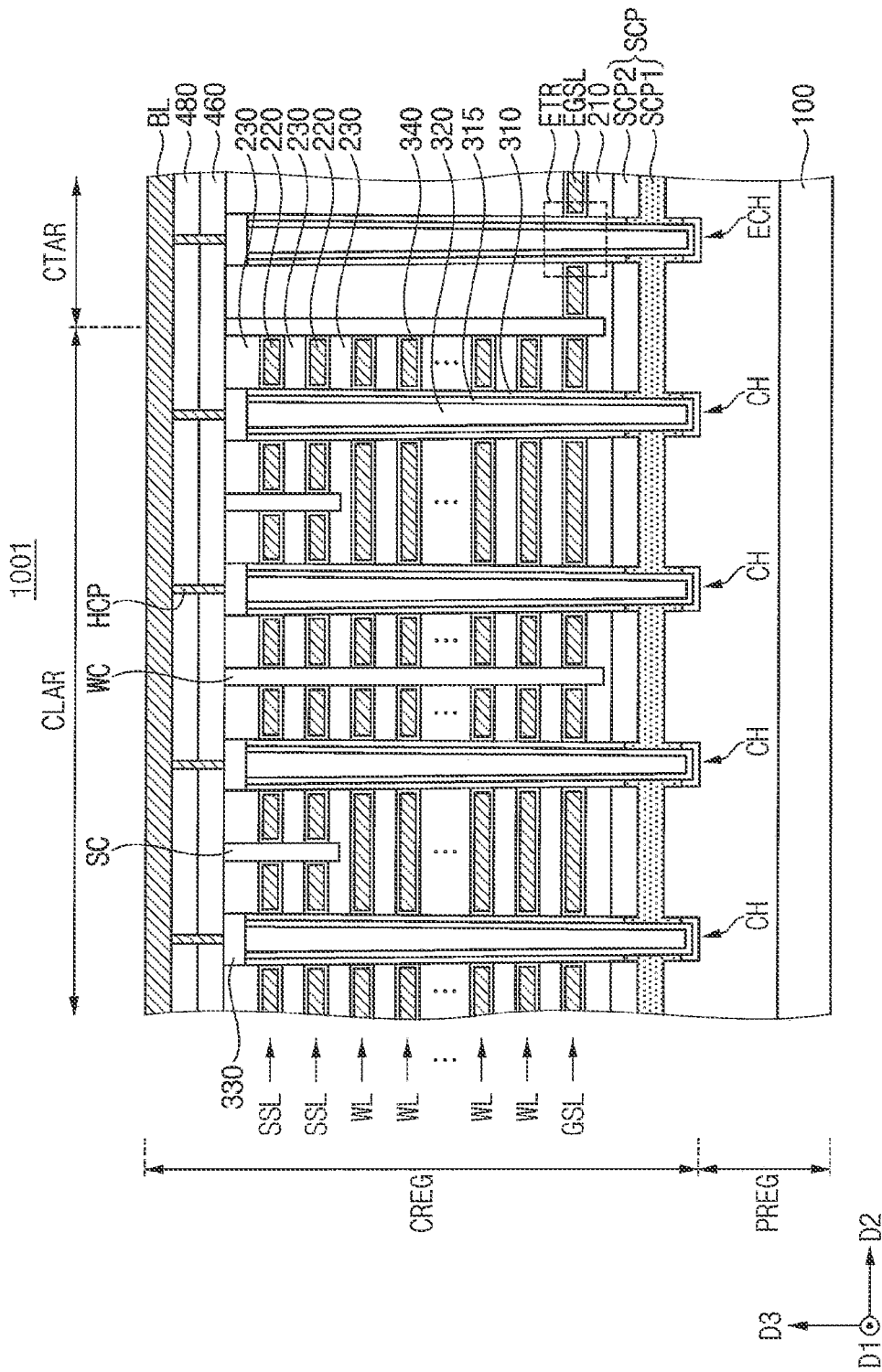
FIG. 8 is a cross-sectional diagram further illustrating the vertical structure of the nonvolatile memory device of FIG. 7.
Figure 9:
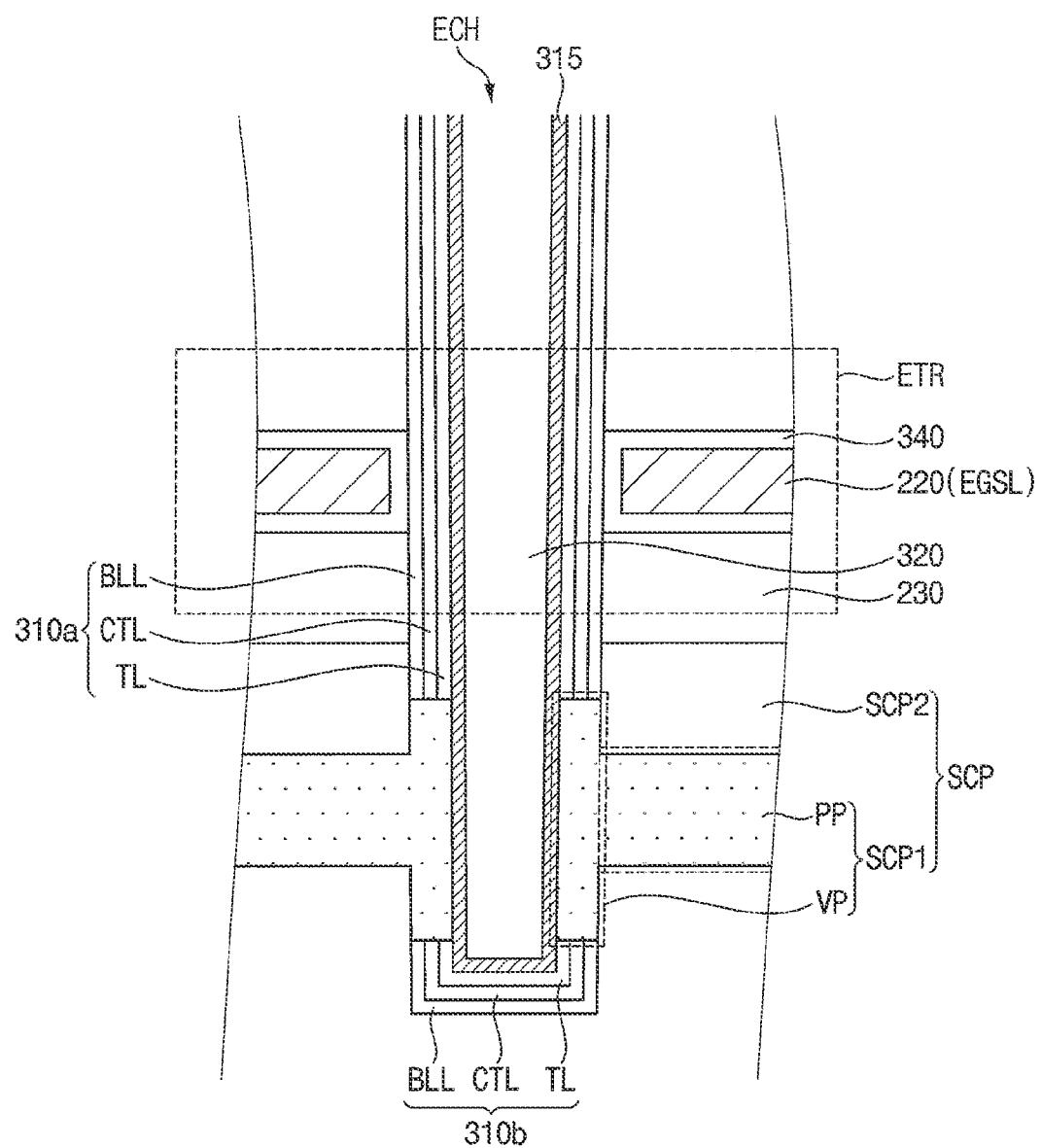
FIG. 9 is an enlarged sectional view illustrating an end portion of an erase channel structure included in the nonvolatile memory device of FIG. 7.

FIG. 7 is a plan (or top down) view further illustrating certain nonvolatile memory devices according to embodiments of the inventive concept, FIG. 8 is a cross-sectional diagram (taken along the second horizontal direction D2) of the nonvolatile memory device of FIG. 7, and FIG. 9 is an enlarged sectional view of the end portion of an erase channel structure (ETR) identified in FIG. 8.

Referring to FIGS. 7, 8 and 9, a gate electrode structure including gate lines or gate electrodes SSL, WL and GSL may be disposed above a semiconductor substrate 100. The substrate 100 may include a semiconductor material, e.g., silicon, germanium, silicon-germanium, or III-V semiconductor compounds, e.g., GaP, GaAs, GaSb, etc. The gate electrode structure SSL, WL and GSL may be cut by the string selection line cut areas SC and/or the wordline cut areas WC as described above.

The gate electrode structure SSL, WL and GSL may include a buffer oxide layer 210, and gate electrodes 220 and insulating patterns 230, which are alternately and repeatedly stacked on the buffer oxide layer 210. The buffer oxide layer 210 may cover a top surface of the substrate 100. The buffer oxide layer 210 may include, for example, a thermally-grown oxide layer or a silicon oxide layer. The gate electrodes 220 may include at least one ground selection gate electrode GSL, cell gate electrodes WL, and at least one string selection gate electrode SSL. The ground selection gate electrode GSL may be the lowermost electrode of the gate electrodes 220, and the string selection gate electrode SSL may be the uppermost electrode of the gate electrodes 220. The cell gate electrodes WL may be disposed between the ground selection gate electrode GSL and the string selection gate electrode SSL. The gate electrodes 220 may be formed of or may include at least one of, for example, doped silicon, metals (e.g., tungsten), metal nitrides, metal silicides, or any combination thereof.

The insulating patterns 230 may be disposed between the gate electrodes 220, which are placed adjacent to each other in the vertical direction D3 perpendicular to the top surface of the substrate 100. The majority of the insulating patterns 230 may have the same thickness, and at least one of the insulating patterns 230 may be thicker than other insulating patterns. For example, an uppermost insulating pattern (hereinafter, a first insulating pattern) on the string selection gate electrode SSL may be thicker than underlying insulating patterns. The first insulating pattern may be thicker by at least two times than the underlying insulating patterns. The insulating patterns 230 may be formed of or may include, for example, silicon oxide.

As described above, the nonvolatile memory device 1001 may be divided in the vertical direction D3 into the cell region CREG and the peripheral region PREG and may be divided in the second horizontal direction D2 into the cell string area CLAR and the contact area CTAR.

The cell channel structures CH may penetrate the gate electrode structure SSL, WL and GSL. Each cell channel structure CH may include a vertical channel portion 315 and a charge storing structure 310 surrounding the vertical channel portion 315. In addition, each cell channel structure CH may include an internal space, which is formed in the vertical channel portion 315, and a gap-fill layer 320, which is surrounded by the internal space. Each cell channel structure CH may include a pad 330 provided in an upper portion thereof. The cell channel structures CH may be arranged in a zigzag shape or in a line shape, when viewed top down. The vertical channel portions 315 may be electrically connected to the substrate 100. The vertical channel portions 315 may include a single layer or multiple layers. The vertical channel portions 315 may include at least one of, for example, a single crystalline silicon layer, an organic semiconductor layer, or carbon nanostructures.

The charge storing structures 310 may extend along outer sidewalls of the vertical channel portions 315 and in the vertical direction D3. For example, the charge storing structures 310 may have a shape surrounding the outer sidewalls of the vertical channel portions 315. The charge storing structures 310 may include at least one of, for example, a silicon oxide layer, a silicon nitride layer, a silicon oxynitride layer, and high-k dielectric layers and may have a single- or multi-layered structure.

As shown in FIG. 9, each of the charge storing structures 310 may include a tunnel insulating layer TL, a blocking insulating layer BLL, and a charge storing layer CTL. The tunnel insulating layer TL may be disposed adjacent to each of the vertical channel portions 315 to enclose or cover the outer sidewall of the vertical channel portion 315. The blocking insulating layer BLL may be disposed adjacent to the gate electrodes 220. The charge storing layer CTL may be disposed between the tunnel insulating layer TL and the blocking insulating layer BLL. The tunnel insulating layer TL may include, for example, a silicon oxide layer or a high-k dielectric layer (e.g., aluminum oxide (Al2O3) or hafnium oxide (HfO2)). The blocking insulating layer BLL may include, for example, a silicon oxide layer or a high-k dielectric layer (e.g., aluminum oxide (Al2O3) or hafnium oxide (HfO2)). The charge storing layer CTL may include, for example, a silicon nitride layer. The gap-fill layers 320 may include, for example, a silicon oxide layer, a silicon nitride layer, or a silicon oxynitride layer.

The pad 330 may be disposed in the upper portion of each cell channel structure CH and each erase channel structure ECH. The pad 330 may extend laterally to cover the top surface of the vertical channel portion 315 and a top surface of the charge storing structure 310. The pad 330 may cover at least one of a top surface of the tunnel insulating layer TL, a top surface of the charge storing layer CTL, and a top surface of the blocking insulating layer BLL. For example, as shown in FIG. 8, the pad 330 may cover all of the top surfaces of the tunnel insulating layer TL, the charge storing layer CTL, and the blocking insulating layer BLL. The pad 330 may include a semiconductor material that is doped with impurities of the first conductivity type. As an example, the pad 330 may be a highly doped n-type region.

The vertical channel portion 315 and the pad 330 may be formed of a semiconductor material (e.g., silicon). As an example, the vertical channel portion 315 and the pad 330 may include poly silicon. The vertical channel portion 315 and the pad 330 may have different crystallographic structures from each other.

As described above, during the erase operation, the erase voltage Vers may be applied to the bitlines BL, and, through the GIDL phenomenon, electron-hole pairs may be produced in the vertical channel portion 315. The electrons may be moved toward the pads 330 and the holes may be supplied to the vertical channel portions 315. Thus, it may be possible to effectively provide the holes into the charge storing layers CTL from the vertical channel portions 315, during the erase operation, and consequently to improve an erase operation property of the three-dimensional nonvolatile memory device.

A first interlayered insulating layer 460 may be disposed on the gate electrode structure SSL, WL and GSL. The first interlayered insulating layer 460 may cover the top surface of the uppermost insulating pattern 230 and the top surfaces of the pads 330. The first interlayered insulating layer 460 may include, for example, a silicon oxide layer.

A second interlayered insulating layer 480 may be disposed on the first interlayered insulating layer 460. The second interlayered insulating layer 480 may cover a top surface of the first interlayered insulating layer 460. The second interlayered insulating layer 480 may include, for example, a silicon oxide layer. The channel contact plugs HCP may be disposed on each cell channel structure CH and each erase channel structure ECH. The channel contact plugs HCP may penetrate the second and first interlayered insulating layers 460 and 480 and may be in direct contact with the pads 330. The channel contact plugs HCP may include at least one of, for example, metal materials (e.g., copper or tungsten) and metal nitrides (e.g., TiN, TaN, or WIN).

The bitlines BL may be disposed on the second interlayered insulating layer 480. The bitlines BL may extend in second horizontal direction D2 in the cell string area CLAR and the contact area CTAR. The bitlines BL may be arranged to be spaced apart from each other in the first horizontal direction D1. Each bitline BL may be electrically connected to the cell channel structures CH and the erase channel structure ECH arranged along the second horizontal direction D2. The bitlines BL may include, for example, a metal material.

The charge storing structure 310 may be provided to enclose the side surface of the vertical channel portion 315 and may be interposed between the bottom surface of the vertical channel portion 315 and the substrate 100. In other words, the vertical channel portion 315 may be separated from the substrate 100.

A source conductive pattern SCP may be disposed between the substrate 100 and the buffer oxide layer 210. The source conductive pattern SCP may include a first source conductive pattern SCP1 and a second source conductive pattern SCP2. The second source conductive pattern SCP2 may be disposed on a top surface of the first source conductive pattern SCP1. The first source conductive pattern SCP1 may be extended from a region between the substrate 100 and the second source conductive pattern SCP2 to other regions between the second source conductive pattern SCP2 and the vertical channel portion 315 and between the substrate 100 and the vertical channel portion 315. As illustrated in FIG. 9, due to the first source conductive pattern SCP1, the charge storing structure 310 may be divided into an upper charge storing structure 310a, which is placed on the first source conductive pattern SCP1, and a lower charge storing structure 310b, which is placed below the first source conductive pattern SCP1.

In some embodiments, the first source conductive pattern SCP1 may include a horizontal portion PP and a vertical portion VP. The horizontal portion PP of the first source conductive pattern SCP1 may be disposed between the substrate 100 and the second source conductive pattern SCP2. The vertical portion VP may be extended from a region between the vertical channel portion 315 and the horizontal portion PP to other regions between the second source conductive pattern SCP2 and the vertical channel portion 315 and between the substrate 100 and the vertical channel portion 315. The vertical portion VP may be in contact with the charge storing structure 310. A top surface of the vertical portion VP may be located at a vertical level between a top surface of the horizontal portion PP and a top surface of the second source conductive pattern SCP2. A bottom surface of the vertical portion VP may be located at a lower vertical level than the top surface of the substrate 100. The first and second source conductive patterns SCP1 and SCP2 may be formed of a polysilicon layer, which is doped with impurities of the first conductivity type, and a concentration of impurities doped into the second source conductive pattern SCP2 may be higher than that in the first source conductive pattern SCP1. Such source conductive pattern SCP may be used as the above-described source line CSL.

In some embodiments, the erase channel structures ECH may be formed in the contact area CTAR that is adjacent to the cell string area CLAR in the second horizontal direction D2. The erase channel structures ECH are connected between the bitlines BL and the source line CSL. The erase channel structures ECH include the erase transistors ETR, respectively. The erase selection line EGSL is formed in the contact area CTAR to form the gate electrodes of the erase transistors ETR in the erase channel structures ECH.

In certain embodiments like the one illustrated in FIGS. 7 and 8, one erase channel structure ECH may be connected to one bitline BL.

In some embodiments like the one illustrated in FIG. 8, the source line CSL may extend uninterrupted (without cutting) in the second horizontal direction D2 through the cell string area CLAR and to the contact area CTAR. With this configuration, the source line CSL may be commonly connected to the cell channel structures CH and the erase channel structures ECH. Accordingly, the erase voltage Vers applied to the source line CSL may be applied to the bottom portions of the cell channel structures CH and simultaneously applied to the upper portions of the cell channel structures CH through the erase channel structures ECH and the bitlines BL.

Figure 10:
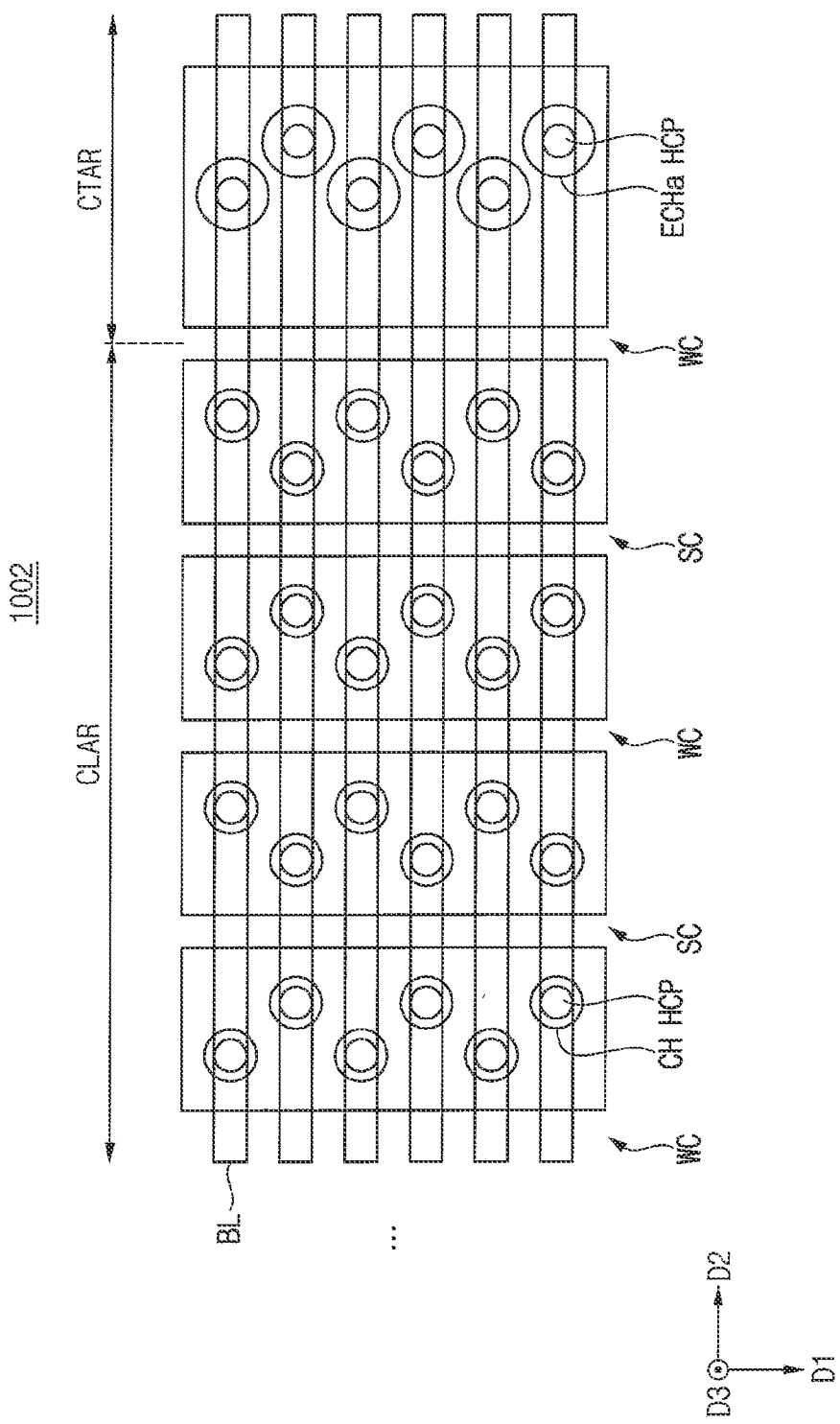
FIG. 10 is a plan view of a nonvolatile memory device according to embodiments of the inventive concept.
Figure 11:
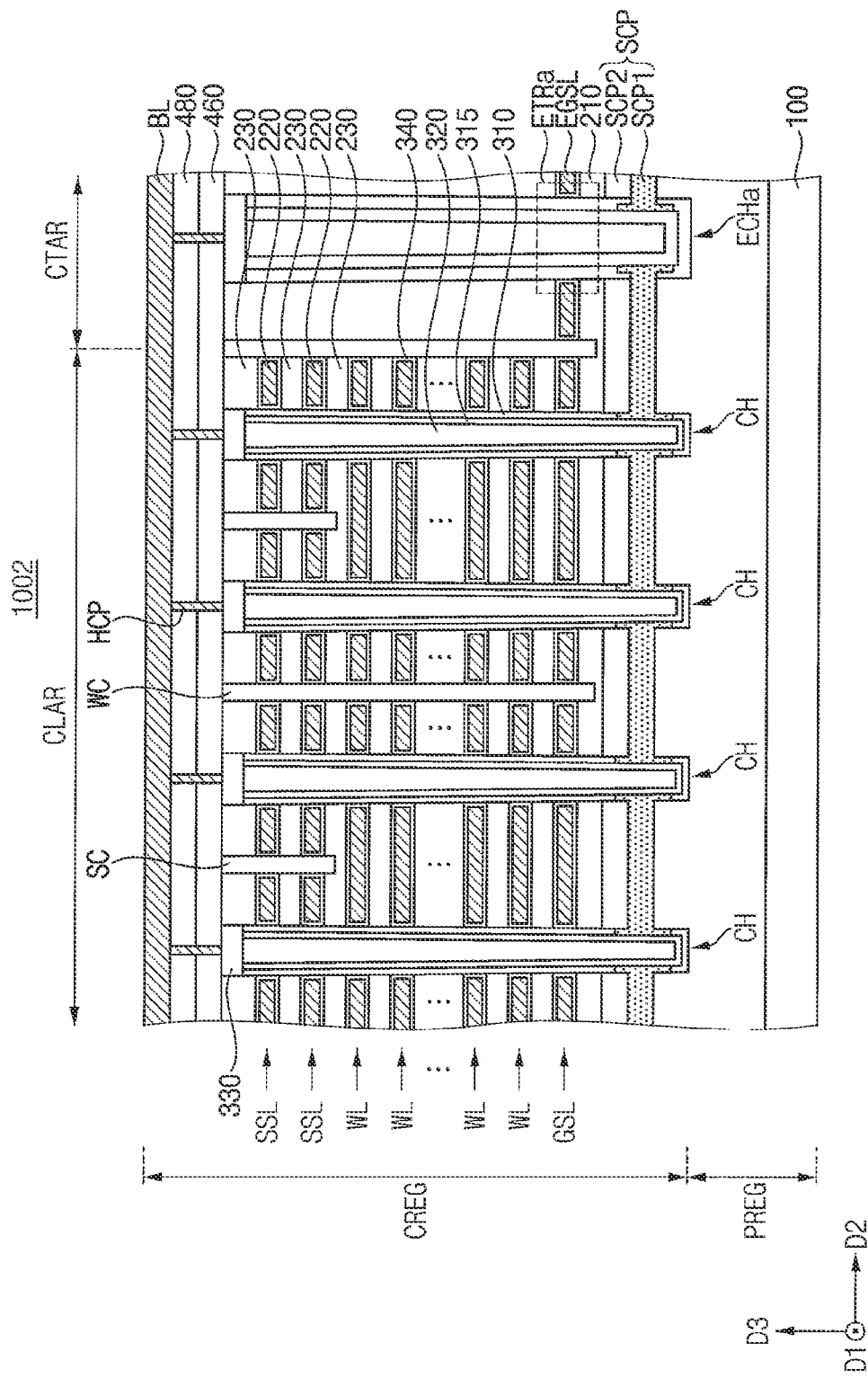
FIG. 11 is a cross-sectional diagram further illustrating the vertical structure of the nonvolatile memory device of FIG. 10.
Figure 12:
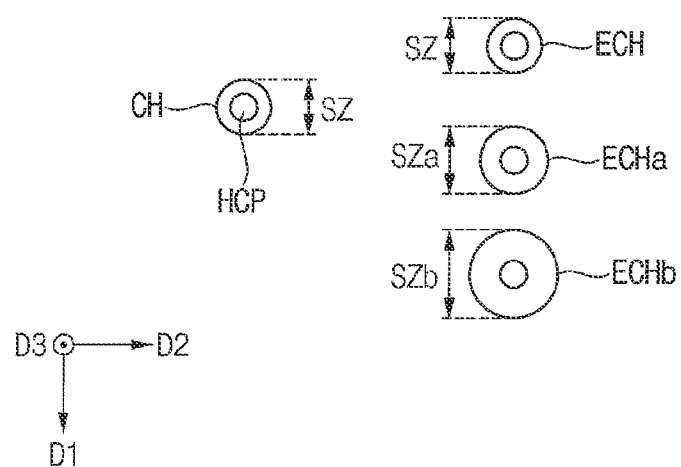
FIG. 12 is a diagram illustrating various erase channel structures that may be included in the nonvolatile memory device of FIG. 10.

FIG. 10 is a plan view of another nonvolatile memory device according to embodiments of the inventive concept, FIG. 11 is a cross-sectional diagram further illustrating the vertical structure of the nonvolatile memory device of FIG. 10, and FIG. 12 is a diagram more particularly illustrating an erase channel structure that may be included in the nonvolatile memory device of FIG. 10.

Referring to FIGS. 10 and 11, a nonvolatile memory device 1002 includes an erase selection line EGSL and a erase channel structures ECH, which are formed in the contact area CTAR that is adjacent to the cell string area CLAR in the second horizontal direction D2.

The erase channel structures ECH are connected between the bitlines BL and the source line CSL. The erase channel structures ECH include the erase transistors ETR, respectively. The erase selection line EGSL forms the gate electrodes of the erase transistors ETR in the erase channel structures ECH.

Referring to FIG. 12, a size of horizontal cross-section (that is, a horizontal cross-sectional area) of the erase channel structures ECH may be appropriately implemented according to the operating modes and/or characteristics of the nonvolatile memory device.

In some embodiments such as the one illustrated in FIGS. 7 and 8, the size SZ of the horizontal cross-section of the cell channel structure CH in the cell string area CLAR may be equal to the size SZ of the horizontal cross-section of the erase channel structure ECH in the contact area CTAR. However, in some embodiments like the one illustrated in FIGS. 10 and 11, the size SZ of the horizontal cross-section of the cell channel structure CH in the cell string area CLAR may be may be different from the size SZ of the horizontal cross-section of the erase channel structure ECH in the contact area CTAR. Thus, as illustrated in FIG. 12, the erase channel structures ECH, ECHa and ECHb having the various sizes SZ, SZa and SZb may be implemented according to various embodiments of the inventive concept.

And in this regard, the resistance between the source line CSL and the bitline BL may decrease as the size of the cross-section of the channel structure is increases. Accordingly, the GIDL current generated by the cell channel structures CH during the erase operation may be adjusted by the horizontal cross-sectional area of the erase channel structures ECH.

Figure 13:
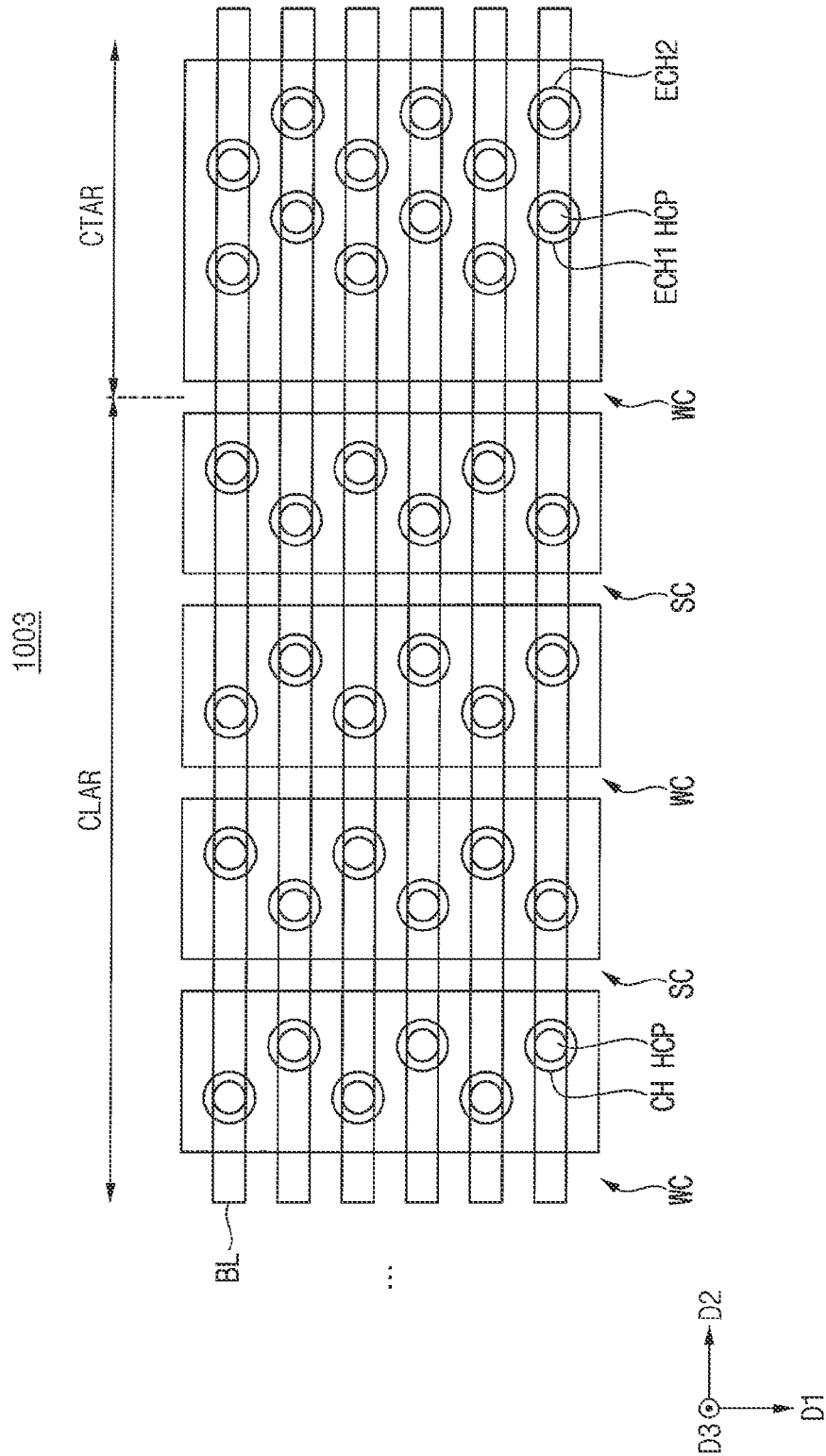
FIG. 13 is a plan view of a nonvolatile memory device according to embodiments of the inventive concept.
Figure 14:
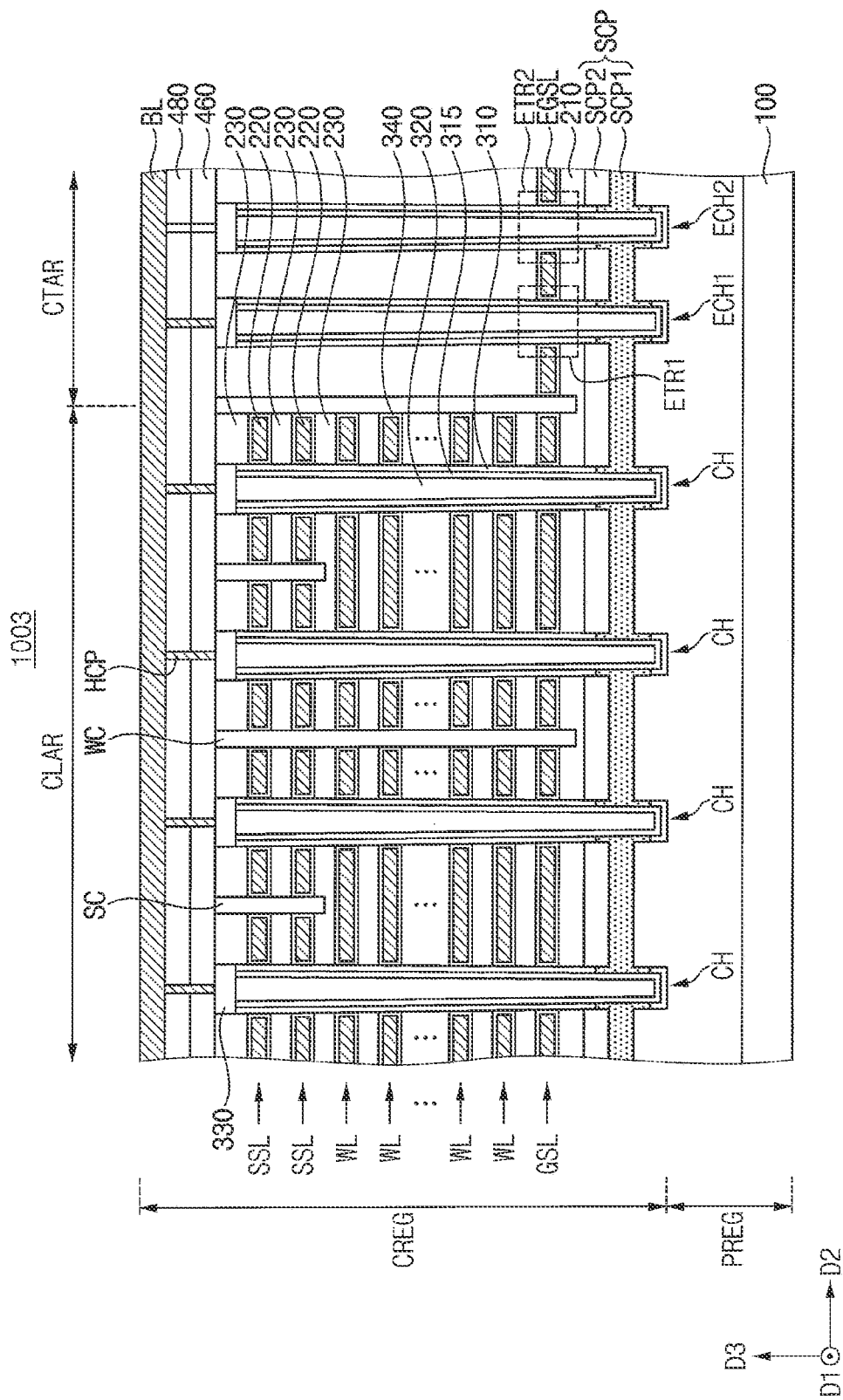
FIG. 14 is a cross-sectional diagram further illustrating the vertical structure of the nonvolatile memory device of FIG. 13.

FIG. 13 is a plan view of yet another nonvolatile memory device according to embodiments of the inventive concept, and FIG. 14 is a cross-sectional diagram further illustrating the vertical structure of the nonvolatile memory device of FIG. 13.

Referring to FIGS. 13 and 14, a nonvolatile memory device 1003 includes an erase selection line EGSL and a erase channel structures ECH, which are formed in the contact area CTAR that is adjacent to the cell string area CLAR in the second horizontal direction D2.

The erase channel structures ECH are connected between the bitlines BL and the source line CSL. The erase channel structures ECH include the erase transistors ETR, respectively. The erase selection line EGSL forms the gate electrodes of the erase transistors ETR in the erase channel structures ECH.

In some embodiments like the one illustrated in FIGS. 13 and 14, two or more erase channel structures ECH may be connected to one bitline BL. Although FIGS. 13 and 14 illustrate two (2) erase channel structures ECH1 and ECH2 for convenience of illustration, three or more erase channel structures may be connected to each bitline BL.

Here, the resistance between the source line CSL and the bitline BL may decrease as the number of the erase channel structures ECH connected to each bitline BL increases. Accordingly, the GIDL current generated by the cell channel structures CH during the erase operation may be adjusted according to the number of the erase channel structures ECH connected to each bitline BL.

Figure 16:
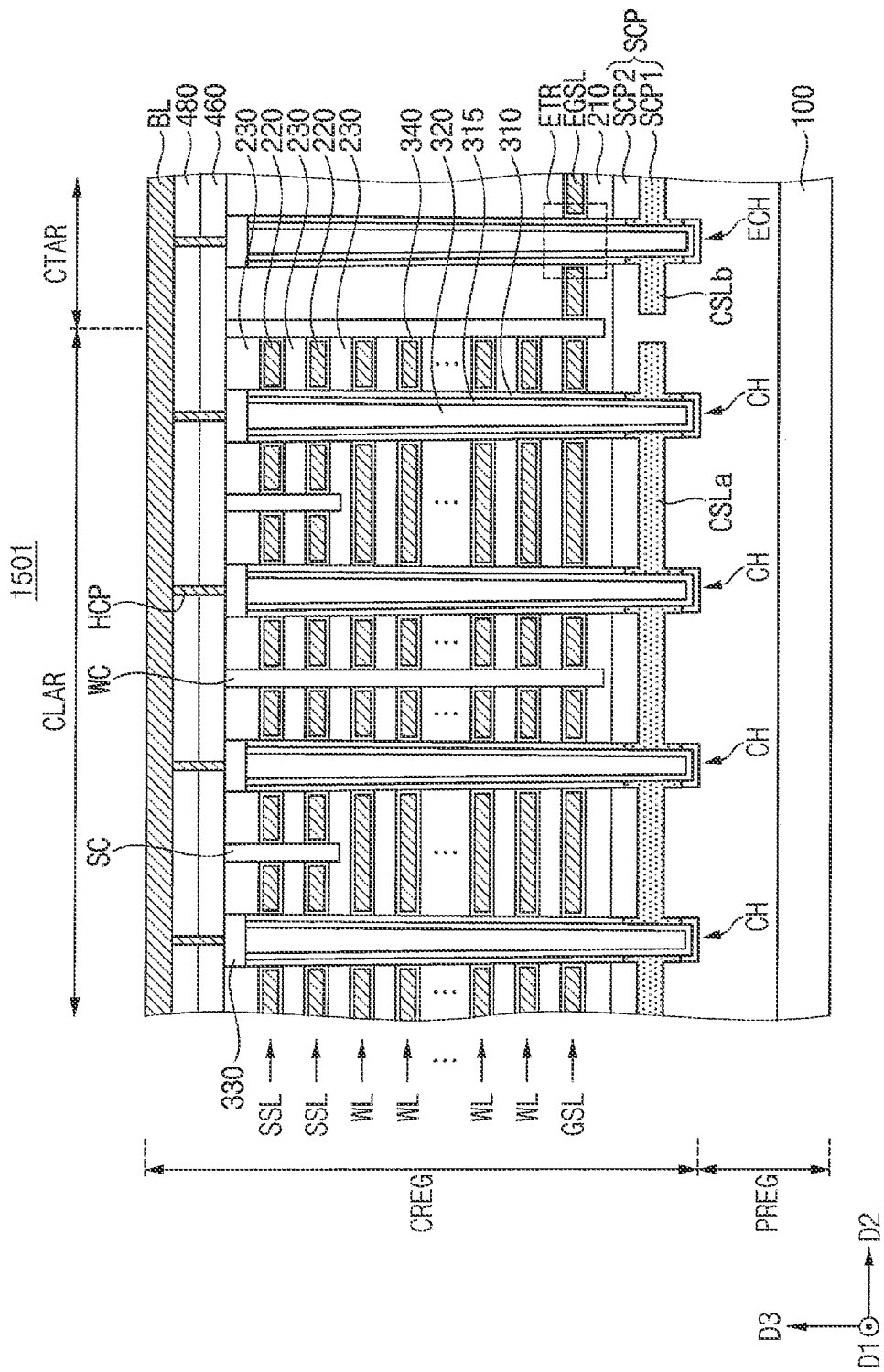
FIG. 16 is a cross-sectional diagram further illustrating the vertical structure of the nonvolatile memory device of FIG. 15.

FIG. 15 is a perspective view illustrating still another nonvolatile memory device according to embodiments of the inventive concept, and FIG. 16 is a cross-sectional diagram further illustrating the vertical structure of the nonvolatile memory device of FIG. 15.

Referring to FIGS. 15 and 16, a nonvolatile memory device 1500 may include a bitlines BL, at least one source line CSL, cell channel structures CH, a gate electrode structure, erase channel structures ECH and an erase selection line EGSL.

The bitlines BL may be disposed at a first end portion (in a vertical direction D3) of a cell region CREG. Here, the bitlines BL may be arranged in the first horizontal direction D1 and extend in the second horizontal direction D2.

The source line CSL may be disposed at a second end portion (in the vertical direction D3) of the cell region CREG and extend in the second horizontal direction D2. In some embodiments, the source line CSL may include a multiple lines arranged in the first horizontal direction D1. In some embodiments, as illustrated in FIG. 1, the source line CSL may be implemented as a common source line having a planar shape.

In some embodiments, like the one illustrated in FIGS. 15 and 16, the source line CSL may be cut at the boundary between the cell string area CLAR and the contact area CTAR such that the source line CSL may be divided into a first source line segment CSLa and a second source line segment CSLb.

The first source line segment CSLa may be connected to the cell channel structures CH and the second source line segment CSLb may be connected to the erase channel structures ECH. Thus, during the erase operation, a first erase voltage Vers1 applied to the cell channel structures CH may be controlled independently of a second erase voltage Vers2 applied to the erase channel structures ECH. In other words, voltage levels of the first and second erase voltages Vers1 and Vers2 may be different from each other, and/or the timing of applying the first and second erase voltages Vers1 and Vers2 may be different from each other.

The cell channel structures CH may be disposed in the cell string area CLAR of the cell region CREG and respectively connected between the bitlines BL and the source line CSL. As will be described below, each cell channel structure CH may include at least one string selection transistor, a memory cells and at least one ground selection transistor.

The gate electrode structure may include gate lines vertically stacked in the cell string area CLAR. The gate electrode structure may include at least one string selection line SSL, wordlines WL and at least one ground selection line GSL. The string selection line SSL corresponds to gate electrodes of the string selection transistors, the wordlines WL correspond to gate electrodes of the memory cells and the ground selection line GSL corresponds to gate electrodes of the ground selection transistors. The wordlines WL may be cut by wordline cut areas WC, and the string selection line SSL may be cut by the wordline cut areas WC and string selection line cut arrears SC.

FIGS. 15 and 16 illustrate an embodiment including two (2) string selection lines SSL and the one (1) ground selection line GSL, however the number of the string selection lines and the number of the ground selection lines may vary by design.

The erase channel structures ECH may be disposed in the contact area CTAR of the cell region CREG The erase channel structures ECH may be respectively connected between the bitlines BL and the source line CSL. The erase channel structures ECH may include erase transistors ETR.

The erase selection line EGSL may be disposed in the contact area CTAR to form a gate electrode of the erase transistors ETR. The erase transistor ETR may be switched by a control signal CON having a turn-ON voltage or a turn-OFF voltage according to various operating modes. During an erase operation, the erase transistor ETR may be turned ON by applying the turn-ON voltage to the erase selection line EGSL to apply erase voltage Vers on the source line CSL to the bitline BL. In contrast, during a program operation and a read operation, the erase transistor ETR may be turned OFF by applying the turn-OFF voltage to the erase selection line EGSL to electrically disconnect the bitline BL from the source line CSL.

As illustrated in FIGS. 15 and 16, the ground selection transistor of the cell channel structure CH and the erase transistor ETR of the erase channel structure ECH may be disposed at the same height. In this case, the erase selection line EGSL may be a portion of the ground selection line GSL such that the portion corresponding to the erase selection line GSL may be provided by cutting the ground selection line GSL at the boundary between the cell string area CLAR and the contact area CTAR. For example, the ground selection line GSL may be cut by the wordline cut area WC at the boundary between the cell string area CLAR and the contact area CTAR, and the portion of the ground selection line GSL in the contact area CTAR may be implemented as the erase selection line EGSL.

As such, the nonvolatile memory device according to embodiments of the inventive concept may reduce the size of the page buffer circuit, and the size of the nonvolatile memory device including the page buffer circuit by removing the erase transistor ETR to apply the erase voltage Vers to the bitline BL from the page buffer circuit and implementing the erase transistor ETR using the erase channel structure ECH.

Figure 17:
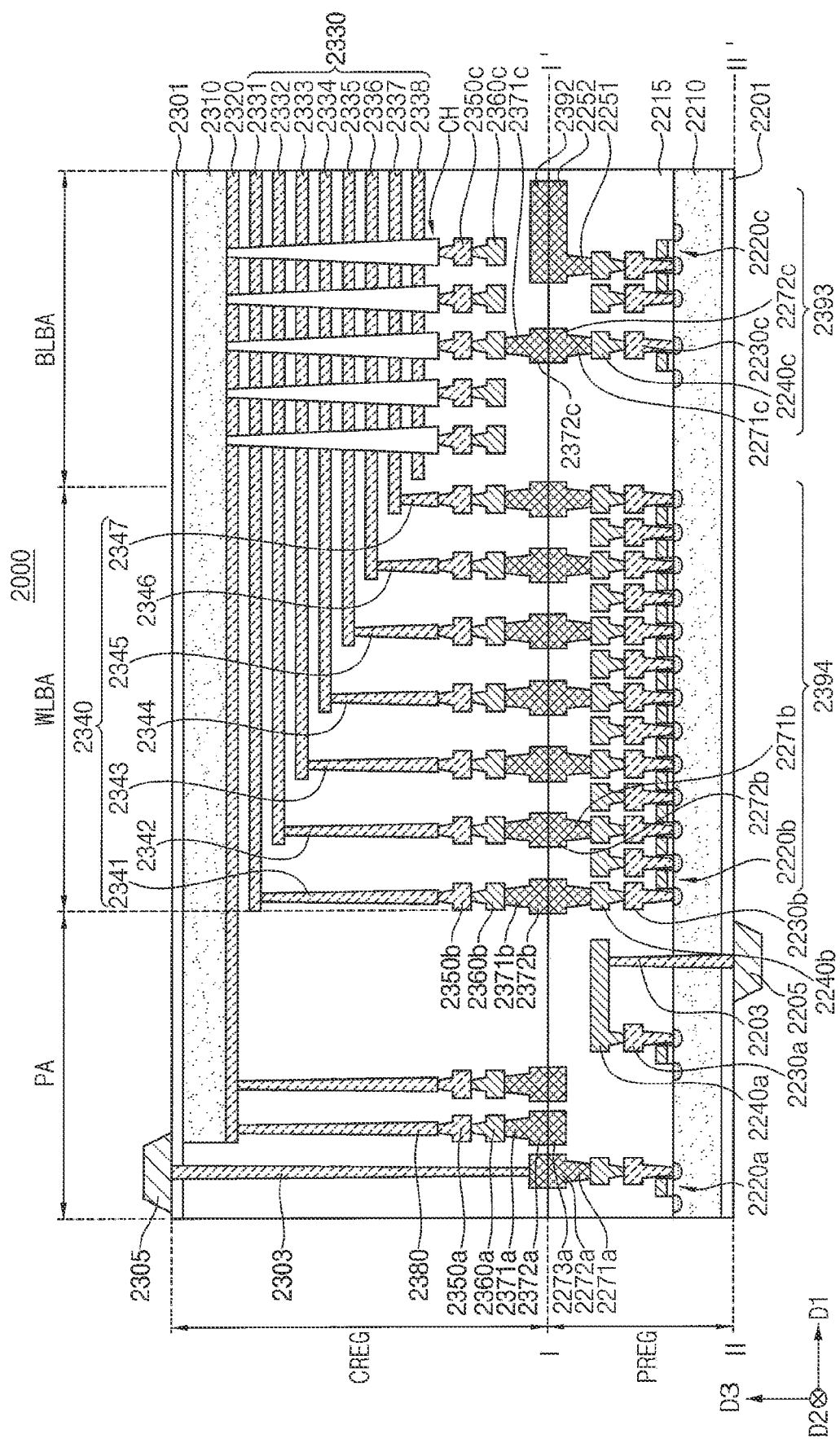
FIGS. 17 and 18 are respective cross-sectional diagrams illustrating a nonvolatile memory device according to embodiments of the inventive concept.
Figure 18:
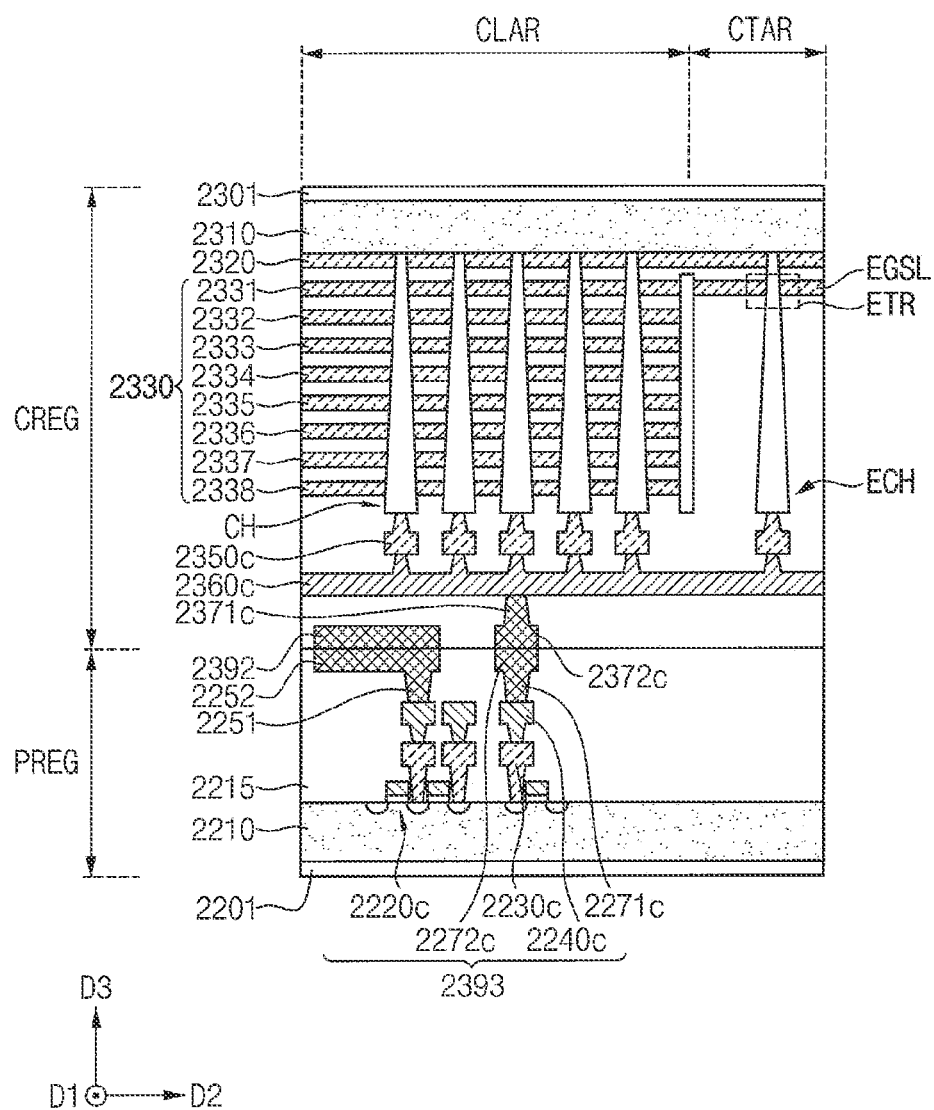

FIGS. 17 and 18 are cross-sectional diagrams illustrating a nonvolatile memory device 2000 according to embodiments of the inventive concept.

Referring to FIG. 17, the nonvolatile memory device or a memory device 2000 may have a chip-to-chip (C2C) structure. Here, the term "C2C structure" denotes a structure in which an upper chip includes a memory cell region (e.g., the cell region CREG) on a first wafer, and a lower chip includes a peripheral circuit region (e.g., the peripheral region PREG) on a second wafer, wherein the upper chip and the lower chip are bonded (or mounted) together. In this regard, the bonding process may include a method of electrically connecting a bonding metal formed on an uppermost metal layer of the upper chip and a bonding metal formed on an uppermost metal layer of the lower chip. For example, the bonding metals may include copper (Cu) using a Cu-to-Cu bonding. The example embodiment, however, may not be limited thereto. For example, the bonding metals may also be formed of aluminum (Al) or tungsten (W).

Each of the peripheral region PREG and the cell region CREG of the memory device 2000 may include an external pad bonding area PA, a wordline bonding area WLBA, and a bitline bonding area BLBA.

For example, the peripheral region PREG may include a first substrate 2210, an interlayer insulating layer 2215, circuit elements 2220a, 2220b, and 2220c formed on the first substrate 2210, first metal layers 2230a, 2230b, and 2230c respectively connected to the circuit elements 2220a, 2220b, and 2220c, and second metal layers 2240a, 2240b, and 2240c formed on the first metal layers 2230a, 2230b, and 2230c. In some embodiments, the first metal layers 2230a, 2230b, and 2230c may be formed of tungsten having relatively high electrical resistivity, and the second metal layers 2240a, 2240b, and 2240c may be formed of copper having relatively low electrical resistivity.

In some embodiments like the one illustrated in FIG. 17, although only the first metal layers 2230a, 2230b, and 2230c and the second metal layers 2240a, 2240b, and 2240c are shown and described, the example embodiment is not limited thereto, and one or more additional metal layers may be further formed on the second metal layers 2240a, 2240b, and 2240c. At least a portion of the one or more additional metal layers formed on the second metal layers 2240a, 2240b, and 2240c may be formed of aluminum or the like having a lower electrical resistivity than those of copper forming the second metal layers 2240a, 2240b, and 2240c.

The interlayer insulating layer 2215 may be disposed on the first substrate 2210 and cover the circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the wordline bonding area WLBA. In the wordline bonding area WLBA, the lower bonding metals 2271b and 2272b in the peripheral region PREG may be electrically bonded to upper bonding metals 2371b and 2372b of the cell region CREG. The lower bonding metals 2271b and 2272b and the upper bonding metals 2371b and 2372b may be formed of aluminum, copper, tungsten, or the like. Further, the upper bonding metals 2371b and 2372b in the cell region CREG may be referred as first metal pads and the lower bonding metals 2271b and 2272b in the peripheral region PREG may be referred as second metal pads.

The cell region CREG may include at least one memory block. The cell region CREG may include a second substrate 2310 and a common source line 2320. On the second substrate 2310, wordlines 2331, 2332, 2333, 2334, 2335, 2336, 2337, and 2338 (i.e., 2330) may be vertically stacked (in direction D3 or a Z-axis) perpendicular to an upper surface of the second substrate 2310. At least one string selection line and at least one ground selection line may be arranged on and below the wordlines 2330, respectively, and the wordlines 2330 may be disposed between the at least one string selection line and the at least one ground selection line.

In the bitline bonding area BLBA, a channel structure CH may vertically extend perpendicular to the upper surface of the second substrate 2310, and pass through the wordlines 2330, the at least one string selection line, and the at least one ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bitline contact, and the second metal layer 2360c may be a bitline. In an example embodiment, the bitline 2360c may extend in a second horizontal direction D2 (e.g., a Y-axis direction), parallel to the upper surface of the second substrate 2310.

In the illustrated example of FIG. 17, an area in which the channel structure CH, the bitline 2360c, and the like are disposed may be defined as the bitline bonding area BLBA. In the bitline bonding area BLBA, the bitline 2360c may be electrically connected to the circuit elements 2220c providing a page buffer 2393 in the peripheral region PREG. The bitline 2360c may be connected to upper bonding metals 2371c and 2372c in the cell region CREG, and the upper bonding metals 2371c and 2372c may be connected to lower bonding metals 2271c and 2272c connected to the circuit elements 2220c of the page buffer 2393.

In the wordline bonding area WLBA, the wordlines 2330 may extend in a first horizontal direction D1 (e.g., an X-axis direction), parallel to the upper surface of the second substrate 2310 and perpendicular to the second horizontal direction D2, and may be connected to cell contact plugs 2341, 2342, 2343, 2344, 2345, 2346, and 2347 (i.e., 2340). The wordlines 2330 and the cell contact plugs 2340 may be connected to each other in pads provided by at least a portion of the wordlines 2330 extending in different lengths in the first horizontal direction D1. A first metal layer 2350b and a second metal layer 2360b may be connected to an upper portion of the cell contact plugs 2340 connected to the wordlines 2330, sequentially. The cell contact plugs 2340 may be connected to the peripheral region PREG by the upper bonding metals 2371b and 2372b of the cell region CREG and the lower bonding metals 2271b and 2272b of the peripheral region PREG in the wordline bonding area WLBA.

The cell contact plugs 2340 may be electrically connected to the circuit elements 2220b forming a row decoder 2394 in the peripheral region PREG. In an example embodiment, operating voltages of the circuit elements 2220b forming the row decoder 2394 may be different than operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

I/O pads 2205 and 2305 may be disposed in the external pad bonding area PA. A lower insulating film 2201 covering a lower surface of the first substrate 2210 may be formed below the first substrate 2210, and a first I/O pad 2205 may be formed on the lower insulating film 2201. The first I/O pad 2205 may be connected to at least one of the circuit elements 2220a, 2220b, and 2220c disposed in the peripheral region PREG through a first I/O contact plug 2203, and may be separated from the first substrate 2210 by the lower insulating film 2201. In addition, a side insulating film may be disposed between the first I/O contact plug 2203 and the first substrate 2210 to electrically separate the first I/O contact plug 2203 and the first substrate 2210.

An upper insulating film 2301 covering the upper surface of the second substrate 2310 may be formed on the second substrate 2310, and a second I/O pad 2305 may be disposed on the upper insulating layer 2301. The second I/O pad 2305 may be connected to at least one of the circuit elements 2220a, 2220b, and 2220c disposed in the peripheral region PREG through a second I/O contact plug 2303. In some embodiments, the second I/O pad 2305 is electrically connected to a circuit element 2220a.

In some embodiments, the second substrate 2310 and the common source line 2320 may not be disposed in an area in which the second I/O contact plug 2303 is disposed. Also, the second I/O pad 2305 may not overlap the wordlines 2330 in the vertical direction D3 (e.g., the Z-axis direction). The second I/O contact plug 2303 may be separated from the second substrate 2310 in the direction, parallel to the upper surface of the second substrate 310, and may pass through the interlayer insulating layer 2315 of the cell region CREG to be connected to the second I/O pad 2305.

According to embodiments, the first I/O pad 2205 and the second I/O pad 2305 may be selectively formed. For example, the memory device 2000 may include only the first I/O pad 2205 disposed on the first substrate 2210 or the second I/O pad 2305 disposed on the second substrate 2310. Alternatively, the memory device 200 may include both the first I/O pad 2205 and the second I/O pad 2305.

A metal pattern provided on an uppermost metal layer may be provided as a dummy pattern or the uppermost metal layer may be absent, in each of the external pad bonding area PA and the bitline bonding area BLBA, respectively included in the cell region CREG and the peripheral region PREG.

In the external pad bonding area PA, the memory device 2000 may include a lower metal pattern 2273a, corresponding to an upper metal pattern 2372a formed in an uppermost metal layer of the cell region CREG, and having the same cross-sectional shape as the upper metal pattern 2372a of the cell region CREG so as to be connected to each other, in an uppermost metal layer of the peripheral region PREG. In the peripheral region PREG, the lower metal pattern 2273a formed in the uppermost metal layer of the peripheral region PREG may not be connected to a contact. In similar manner, in the external pad bonding area PA, an upper metal pattern 2372a, corresponding to the lower metal pattern 2273a formed in an uppermost metal layer of the peripheral region PREG, and having the same shape as a lower metal pattern 2273a of the peripheral region PREG, may be formed in an uppermost metal layer of the cell region CREG.

The lower bonding metals 2271b and 2272b may be formed on the second metal layer 2240b in the wordline bonding area WLBA. In the wordline bonding area WLBA, the lower bonding metals 2271b and 2272b of the peripheral region PREG may be electrically connected to the upper bonding metals 2371b and 2372b of the cell region CREG by a Cu-to-Cu bonding.

Further, in the bitline bonding area BLBA, an upper metal pattern 2392, corresponding to a lower metal pattern 2252 formed in the uppermost metal layer of the peripheral region PREG, and having the same cross-sectional shape as the lower metal pattern 2252 of the peripheral region PREG, may be formed in an uppermost metal layer of the cell region CREG. A contact may not be formed on the upper metal pattern 2392 formed in the uppermost metal layer of the cell region CREG.

As illustrated in FIG. 18, according to certain embodiments of the inventive concept, the nonvolatile memory device 2000 may include an erase selection line EGSL and a erase channel structures ECH, which are formed in the contact area CTAR that is adjacent to the cell string area CLAR in the second horizontal direction D2.

The erase channel structures ECH are connected between the bitlines BL and the source line CSL. The erase channel structures ECH include the erase transistors ETR, respectively. The erase selection line EGSL forms the gate electrodes of the erase transistors ETR in the erase channel structures ECH.

As such, the nonvolatile memory device 2000 may include a page buffer circuit of reduced size achieved by removing the erase transistor ETR to apply the erase voltage Vers to the bitline BL from the page buffer circuit and implementing the erase transistor ETR using the erase channel structure ECH.

Figure 19:
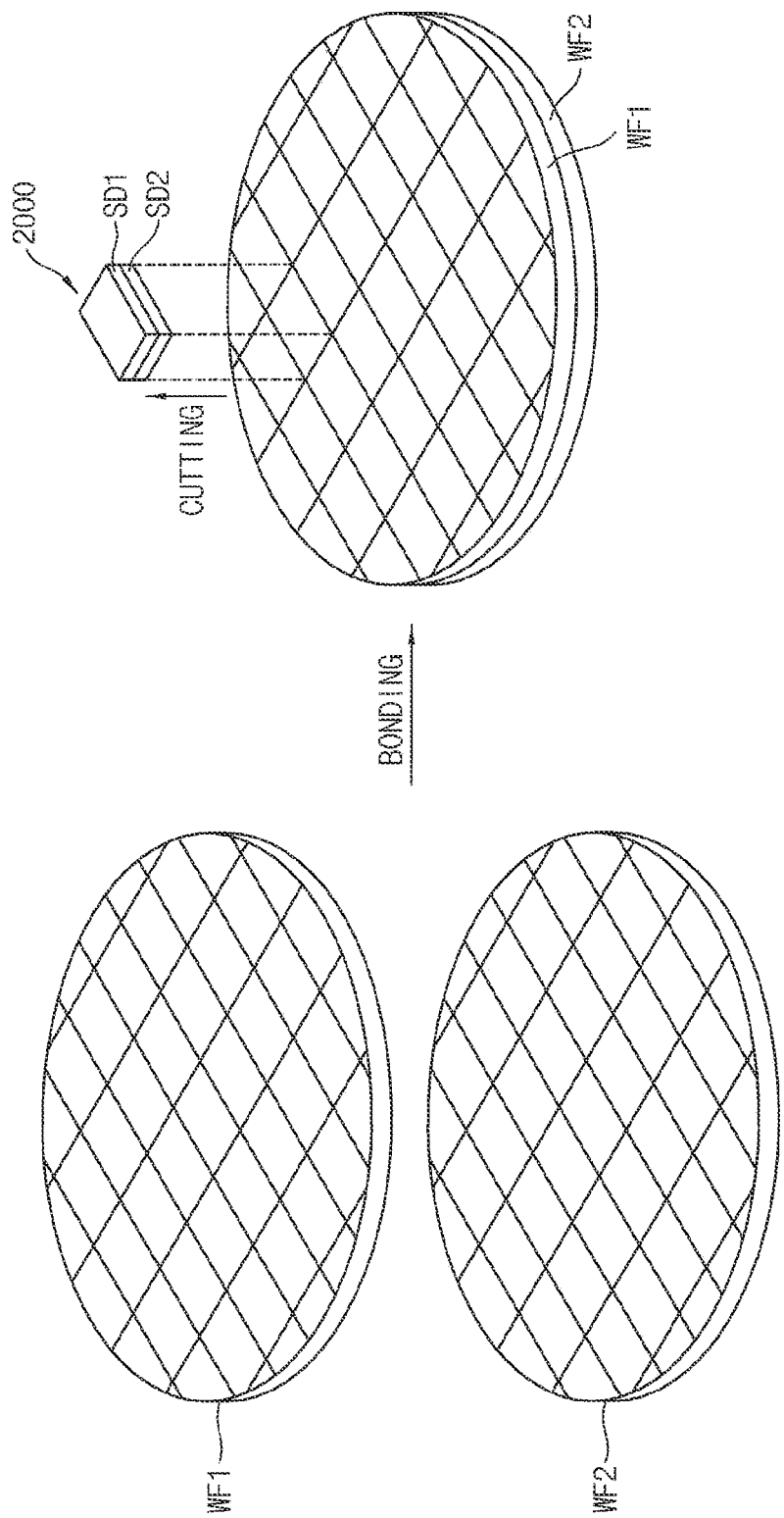
FIG. 19 is a conceptual diagram illustrating the manufacture of a stacked semiconductor device according to embodiments of the inventive concept.

FIG. 19 is a conceptual diagram further illustrating an approach to manufacturing a stacked semiconductor device according to embodiments of the inventive concept.

Referring to FIG. 19, respective integrated circuits may be formed on a first wafer WF1 and a second wafer WF2. The above-described memory cell array and erase transistors ETR using the erase channel structures ECH may be formed in the first wafer WF1 and the peripheral circuits may be formed in the second wafer WF2.

After the various integrated circuits have been respectively formed on the first and second wafers WF1 and WF2, the first wafer WF1 and the second wafer WF2 may be bonded together. The bonded wafers WF1 and WF2 may then be cut (or divided) into singulated chips, wherein each chip corresponds to a semiconductor device 2000 including a first semiconductor die SD1 and a second semiconductor die SD2 that are stacked vertically (e.g., the first semiconductor die SD1 is stacked on the second semiconductor die SD2, etc.). Each cut portion of the first wafer WF1 corresponds to the first semiconductor die SD1 and each cut portion of the second wafer WF2 corresponds to a second semiconductor die SD2.

Figure 20:
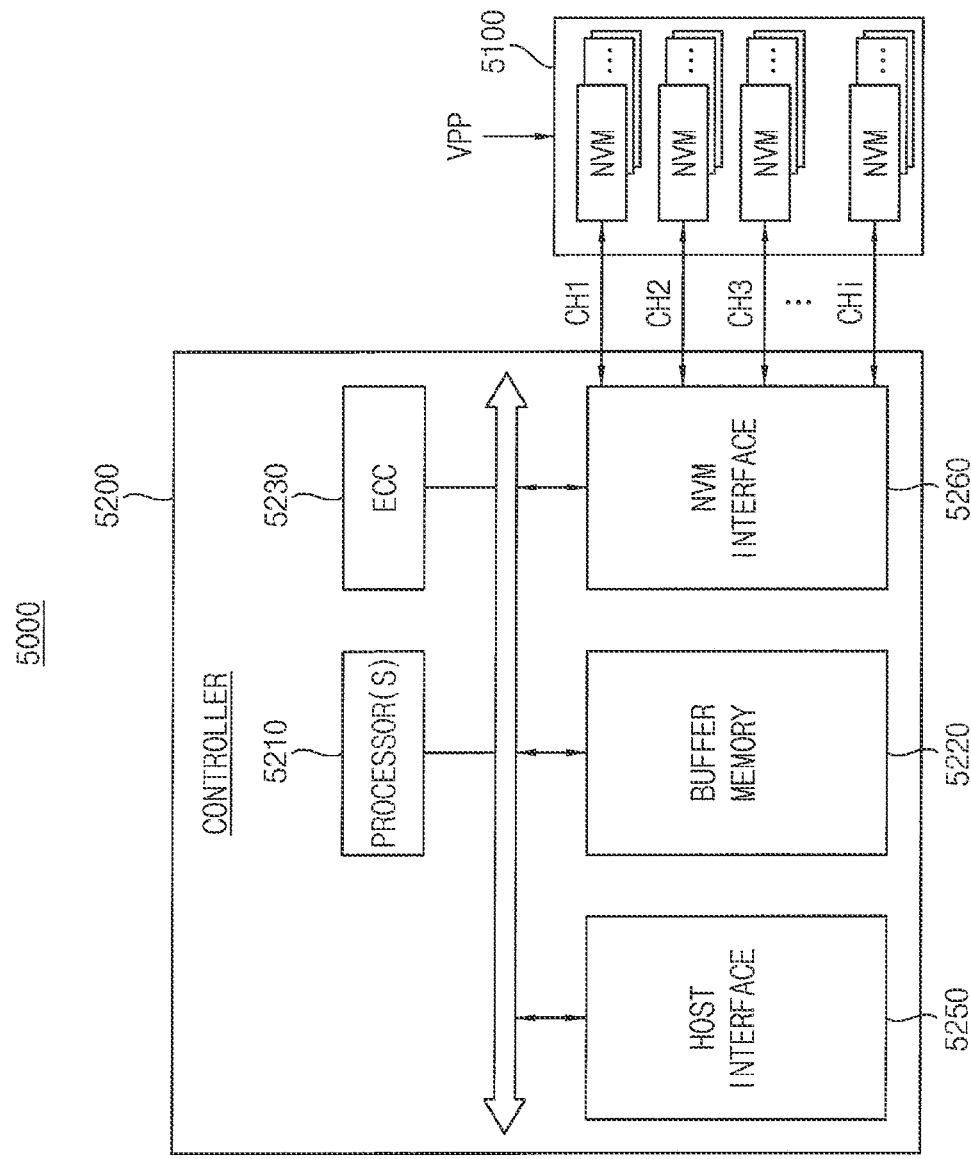
FIG. 20 is a block diagram illustrating a solid state disk or solid state drive (SSD) according to embodiments of the inventive concept.

FIG. 20 is a block diagram illustrating a solid state disk or solid state drive (SSD) 5000 according to embodiments of the inventive concept.

Referring to FIG. 20, the SSD 5000 may generally include nonvolatile memory devices 5100 and an SSD controller 5200.

The nonvolatile memory devices 5100 may (optionally) be configured to receive a high voltage VPP. One or more of the nonvolatile memory devices 5100 may be provided as memory device(s) consistent with embodiments of the inventive concept. Accordingly, the nonvolatile memory devices 5100 may reduce the unit capacity of the erase operation by the grouping of the cell strings, as described above.

The SSD controller 5200 is connected to the nonvolatile memory devices 5100 via multiple channels CH1 to CHi. The SSD controller 1200 includes one or more processors 5210, a buffer memory 5220, an error correction code (ECC) circuit 5230, a host interface 5250, and a nonvolatile memory interface 5260. The buffer memory 5220 stores data used to drive the SSD controller 5200. The buffer memory 5220 comprises multiple memory lines each storing data or a command. The ECC circuit 5230 calculates error correction code values of data to be programmed at a writing operation and corrects an error of read data using an error correction code value at a read operation. In a data recovery operation, The ECC circuit 5230 corrects an error of data recovered from the nonvolatile memory devices 5100.

Consistent with the foregoing embodiments, one or more of the nonvolatile memory device 5100 may include an erase selection line and erase channel structures, wherein the erase channel structures are formed in the contact area adjacent to the cell string area in the second horizontal direction, are connected between the bitlines and the source line, and respectively include erase transistors. Here, the erase selection line may form the gate electrodes of the erase transistors in the erase channel structures.

As such, the nonvolatile memory device and methods of performing an erase operation according to embodiments of the inventive concept allow reduction in the size and/or number of the spare blocks used (e.g.,) to store meta data, thereby allowing an overall reduction in the size of the nonvolatile memory device by reducing unit capacity of the erase operation by grouping of the cell strings. In addition, the operational lifetime of the nonvolatile memory device may be extended by suppressing unnecessary erase operations through the grouping of the cell strings.

Embodiments of the inventive concept may variously be applied to nonvolatile memory devices and systems including the nonvolatile memory device. For example, embodiments of the inventive concept may be applied to systems such as memory cards, solid state drives (SSD), embedded multimedia cards (eMMC), mobile phones, smart phones, personal digital assistants (PDA), portable multimedia players (PMP), digital cameras, camcorders, personal computers (PC), server computers, workstations, laptop computers, digital TV, set-top boxes, portable game consoles, navigation systems, wearable devices, internet of things (IoT) devices, internet of everything (IoE) devices, e-books, virtual reality (VR) devices, augmented reality (AR) device, etc.

The foregoing embodiments are illustrative of the inventive concept which is not limited to only the illustrative embodiments. Although multiple embodiments have been described above, those skilled in the art will readily appreciate that many modifications are possible in these embodiments without materially departing from the scope of the inventive concept.

What is claimed is:

1. A nonvolatile memory device comprising:
   bitlines disposed at a first end portion of a cell region, arranged in a first horizontal direction and extending in a second horizontal direction;
   a source line disposed at a second end portion of the cell region and extending in the second horizontal direction;
   cell channel structures disposed in a cell string area of the cell region, wherein each one of the cell channel structures is connected between the bitlines and the source line and includes a string selection transistor, a ground selection transistor and memory cells;
   a gate electrode structure vertically stacked in the cell string area, wherein the gate electrode structure includes a string selection line, a ground selection line and wordlines;
   erase channel structures disposed in a contact area of the cell region, wherein each one of the erase channel structures is connected between the bitlines and the source line and includes erase transistors; and
   an erase selection line disposed in the contact area to form a gate electrode of the erase transistors.

2. The nonvolatile memory device of claim 1, wherein the ground selection transistor and the erase transistors are disposed at a same height.

3. The nonvolatile memory device of claim 2, wherein the erase selection line is provided by cutting the ground selection line at a boundary between the cell string area and the contact area.

4. The nonvolatile memory device of claim 1, wherein the cell channel structures generate a gate induced drain leakage (GIDL) current during an erase operation, and the GIDL current is adjusted according to a number of the erase channel structures connected to each bitline.

5. The nonvolatile memory device of claim 1, wherein the cell channel structures generate a gate induced drain leakage (GIDL) current during an erase operation, and the GIDL current is adjusted according to a horizontal cross-sectional area of the erase channel structures.

6. The nonvolatile memory device of claim 1, wherein each one of the erase channel structures is connected to one bitline.

7. The nonvolatile memory device of claim 1, wherein at least two of the erase channel structures are connected to one bitline.

8. The nonvolatile memory device of claim 1, wherein a horizontal cross-sectional area of the cell channel structures is equal to a horizontal cross-sectional area of the erase channel structures.

9. The nonvolatile memory device of claim 1, wherein a horizontal cross-sectional area of the cell channel structures is different from a horizontal cross-sectional area of the erase channel structures.

10. The nonvolatile memory device of claim 1, wherein the source line extends uninterrupted in the second horizontal direction through the cell string area to the contact area and is commonly connected to the cell channel structures and the erase channel structures.

11. The nonvolatile memory device of claim 1, wherein the source line is cut at a boundary between the cell string area and the contact area, such that the source line is divided into a first source line segment and a second source line segment.

12. The nonvolatile memory device of claim 11, wherein the first source line segment is connected to the cell channel structures and the second source line segment is connected to the erase channel structures.

13. The nonvolatile memory device of claim 12, wherein, during an erase operation, a first erase voltage applied to the cell channel structures is controlled independently of a second erase voltage applied to the erase channel structures.

14. The nonvolatile memory device of claim 1, wherein, during an erase operation, the erase transistors are turned ON by applying a turn-ON voltage to the erase selection line to apply an erase voltage on the source line to the bitline.

15. The nonvolatile memory device of claim 14, wherein, during a program operation and a read operation, the erase transistors are turned OFF by applying a turn-OFF voltage to the erase selection line to electrically disconnect the bitline from the source line.

16. A nonvolatile memory device having a cell over periphery (COP) structure including a peripheral region including a peripheral circuit and a cell region vertically stacked on the peripheral region and including a memory cell array, the nonvolatile memory device comprising:
  erase channel structures disposed in a contact area adjacent to the memory cell array in a horizontal direction and connected between bitlines and a source line, wherein each one of the erase channel structures includes erase transistors; and
  an erase selection line disposed on the contact area to form a gate electrode of the erase transistors.

17. A nonvolatile memory device comprising:
  first metal pads disposed in a cell region;
  second metal pads disposed in a peripheral region disposed under the cell region, wherein the peripheral region is vertically connected to the cell region by the first metal pads and the second metal pads;
  bitlines disposed at a first end portion of the cell region, arranged in a first horizontal direction and extending in a second horizontal direction;
  a source line disposed at a second end portion of the cell region and extending in the second horizontal direction;
  cell channel structures disposed in a cell string area of the cell region and respectively connected between the bitlines and the source line, wherein each one of the cell channel structures includes a string selection transistor, a ground selection transistor and memory cells;
  a gate electrode structure vertically stacked in the cell string area, wherein the gate electrode structure includes a string selection line, a ground selection line and wordlines;
  erase channel structures disposed in a contact area of the cell region, wherein each one of the erase channel structures is connected between the bitlines and the source line and includes erase transistors; and
  an erase selection line disposed in the contact area to form a gate electrode of the erase transistors.

18. The nonvolatile memory device of claim 17, wherein the first metal pads and the second metal pads are formed of copper.

19. The nonvolatile memory device of claim 17, wherein the first metal pads and the second metal pads are connected by bonding.

20. The nonvolatile memory device of claim 17, wherein the cell region is formed on a first wafer and the peripheral region is formed on a second wafer different from the first wafer.

* * * * *